United States Patent
Arata et al.

(10) Patent No.: US 12,456,666 B2
(45) Date of Patent: Oct. 28, 2025

(54) SEMICONDUCTOR DEVICE AND MANUFACTURING METHOD THEREFOR

(71) Applicant: Mitsubishi Electric Corporation, Tokyo (JP)

(72) Inventors: Kazuki Arata, Tokyo (JP); Ryuichi Ishii, Tokyo (JP); Hiroshi Gokan, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 511 days.

(21) Appl. No.: 18/084,114

(22) Filed: Dec. 19, 2022

(65) Prior Publication Data

US 2023/0378033 A1 Nov. 23, 2023

(30) Foreign Application Priority Data

May 23, 2022 (JP) .................................. 2022-083549

(51) Int. Cl.
*H01L 23/495* (2006.01)
*H01L 21/48* (2006.01)
(Continued)

(52) U.S. Cl.
CPC .... *H01L 23/49568* (2013.01); *H01L 21/4825* (2013.01); *H01L 21/4842* (2013.01);
(Continued)

(58) Field of Classification Search
CPC ............. H01L 21/4825; H01L 21/4842; H01L 21/4882; H01L 2223/6611;
(Continued)

(56) References Cited

U.S. PATENT DOCUMENTS 9,866,213 B1 * 1/2018 Zhang ..................... H01L 24/48
2001/0030362 A1 * 10/2001 Grant ..................... H01L 25/165
257/E25.031

(Continued)

FOREIGN PATENT DOCUMENTS

JP 2012-089794 A 5/2012
JP 6665926 B2 3/2020

OTHER PUBLICATIONS

Takuma Koge et al., "Speed Enhancement for the 3rd-Generation Direct Liquid Cooling Power Module for Automotive Applications with RC-IGBT", Fuji Electric Journal, 2016, pp. 266-269, vol. 89, No. 4.

(Continued)

*Primary Examiner* — Timothy J Thompson
*Assistant Examiner* — Rhadames Alonzo Miller
(74) *Attorney, Agent, or Firm* — Sughrue Mion, PLLC

(57) ABSTRACT

This semiconductor device includes a first dummy terminal extending from a second conductor toward one side in a first direction, a second dummy terminal extending from a fourth conductor toward another side in the first direction, and a third dummy terminal extending from a third conductor through between a third conductive plate and a fourth conductive plate toward one side in a second direction, and connected to a second AC terminal. In a state in which ends of the first dummy terminal, the second dummy terminal, first control terminals, second control terminals, second AC terminals, first AC terminals, N terminals, and P terminals are exposed, the first conductive plate, a second conductive plate, the third conductive plate, the fourth conductive plate, first switching elements, second switching elements, a first conductor, the second conductor, the third conductor, and the fourth conductor are sealed by a resin member.

9 Claims, 13 Drawing Sheets

(51) Int. Cl.
  *H01L 23/552* (2006.01)
  *H01L 23/66* (2006.01)
  *H01L 25/18* (2023.01)
  *H02M 7/00* (2006.01)

(52) U.S. Cl.
  CPC .... *H01L 21/4882* (2013.01); *H01L 23/49562* (2013.01); *H01L 23/49575* (2013.01); *H01L 23/552* (2013.01); *H01L 23/66* (2013.01); *H01L 25/18* (2013.01); *H01L 2223/6611* (2013.01); *H02M 7/003* (2013.01)

(58) Field of Classification Search
  CPC ......... H01L 23/49524; H01L 23/49541; H01L 23/49562; H01L 23/49568; H01L 23/49575; H01L 23/552; H01L 23/66; H01L 24/41; H01L 25/18; H02M 7/003
  See application file for complete search history.

(56) References Cited

U.S. PATENT DOCUMENTS

| | | | |
|---|---|---|---|
| 2014/0015452 A1* | 1/2014 | Nagase | H05K 7/14329 363/131 |
| 2016/0126168 A1* | 5/2016 | Araki | H01L 25/112 257/140 |
| 2017/0110395 A1* | 4/2017 | Iwabuchi | H02M 7/003 |
| 2018/0182694 A1* | 6/2018 | Soyano | H01L 23/3735 |

OTHER PUBLICATIONS

Kousuke Miyaji et al., "Verification of Analytical Model for Wiring Inductance with Measurement", IPSJ SIG Technical Report, 2003-SLDM-110, 2003, pp. 37-42.

* cited by examiner

FIG. 3

| WIRING PATTERN TYPE | a (mm) | b (mm) | l (mm) EACH WIRING AVERAGE USE REFERENCE LENGTH | CALCULATED VALUE EXAMPLE IN PARENTHESES OF EXPRESSION 1 | RATIO (REFERENCE 1) |
|---|---|---|---|---|---|
| 1 | 1 | 24 | 55 | 2.13 | 1.0 |
| 2 | 1 | 20 | 60 | 2.36 | 1.1 |
| 3 | 1 | 6 | 60 | 3.38 | 1.6 |
| 4 | 1 | 12 | 45 | 2.53 | 1.2 |
| 5 | 1 | 18 | 45 | 2.20 | 1.0 |

FIG. 4
PARASITIC INDUCTANCE COEFFICIENT LIST

| CURRENT ROUTE | COEFFICIENT | WIRING PATTERN TYPE |
|---|---|---|
| 6in1 P-SIDE CONDUCTIVE PLATE (HEAT SPREADER) DURING CURRENT CONDUCTION IN LATERAL DIRECTION | k1 | 1 |
| 6in1 N-SIDE CONDUCTOR (LEAD FRAME) DURING CURRENT CONDUCTION IN LATERAL DIRECTION | k2 | 2 |
| 6in1 N-SIDE CONDUCTIVE PLATE (HEAT SPREADER) DURING CURRENT CONDUCTION IN LONGITUDINAL DIRECTION | k3 | 5 |
| FOLLOWING IS NEEDED FOR Ls COMPARISON CALCULATION BETWEEN LONGITUDINAL LEAD-OUT AND LATERAL LEAD-OUT OF P AND N | | |
| 2in1 P-SIDE CONDUCTIVE PLATE (HEAT SPREADER) DURING CURRENT CONDUCTION IN LONGITUDINAL DIRECTION | k4 | 4 |
| 2in1 N-SIDE CONDUCTOR (LEAD FRAME) DURING CURRENT CONDUCTION IN LONGITUDINAL DIRECTION | k5 | 3 |
| 2in1 N-SIDE CONDUCTOR (LEAD FRAME) DURING CURRENT CONDUCTION IN LATERAL DIRECTION | k6 | 3 |
| 2in1 N-SIDE CONDUCTIVE PLATE (HEAT SPREADER) DURING CURRENT CONDUCTION IN LONGITUDINAL DIRECTION | k7 | 5 |
| BUSBAR FOR OUTSIDE CAPACITOR CONNECTION | k8 | 3 |

FIG. 8

| UNIT (nH) | 2in1 normal | 2in1 wide | 6in1 P AND N ON BOTH LEFT AND RIGHT SIDES | | | 6in1 P AND N ON ONE SIDE | | |
|---|---|---|---|---|---|---|---|---|
| | | | U PHASE | V PHASE | W PHASE | U PHASE | V PHASE | W PHASE |
| ONE-TURN Ls BETWEEN P AND N | 19.26 | 16.89 | 8.45 | 8.80 | 8.52 | 16.83 | 14.54 | 12.32 |

SEMICONDUCTOR DEVICE AND MANUFACTURING METHOD THEREFOR

BACKGROUND

The present disclosure relates to a semiconductor device and a manufacturing method therefor.

A semiconductor device is a device configured such that n arms for n phases are stored in a module for 2n switching units using a switching element group including a plurality of switching elements such as MOSFETs, RC-IGBTs, or IGBTs and diodes. In order to store the switching element group in one module, wiring for a busbar and control signals is routed in the module. In recent years, studies have been performed for simplification of a mounting process for a semiconductor device on which large-power switching elements are mounted, size reduction thereof, and reduction of a one-turn loop inductance (hereinafter, referred to as one-turn Ls) parasitic in a power main circuit having an arm configuration and serving as a source for generating high-frequency noise.

A structure of a semiconductor device for which a mounting process is simplified is disclosed (see, for example, Patent Document 1). In the structure disclosed in Patent Document 1, a 6in1 module is manufactured using one lead frame. In addition, structures of a power module with reduced one-turn Ls are disclosed (see, for example, Patent Document 2 and Non-Patent Document 1). In the structure disclosed in Patent Document 2, thirty devices with seven arms for seven phases are formed with eleven modules, and P terminals and N terminals are located on the modules so as to be led out from both of left and right ends in the lateral direction in parallel, thus reducing the one-turn Ls. In Non-Patent Document 1, P terminals and N terminals in a three-phase 6in1 module are provided independently on a one-arm basis longitudinally in the short-side direction, thus reducing the one-turn Ls.

Patent Document 1: Japanese Laid-Open Patent Publication No. 2012-89794

Patent Document 2: Japanese Patent No. 6665926

Non-Patent Document 1: Takuma Koge, et al., "Speed Enhancement for the 3rd-Generation Direct Liquid Cooling Power Module for Automotive Applications with RC-IGBT", Fuji Electric Journal, 2016, Vol. 89, no. 4, pp. 266-269

Non-Patent Document 2: Kousuke Miyaji, et al., "Verification of Analytical Model for Wiring Inductance with Measurement", IPSJ SIG Technical Report, 2003-SLDM-110, pp. 37-42

In Patent Document 1, a 6in1 module is manufactured using one lead frame, whereby the mounting process can be simplified and the device can be downsized. However, in manufacturing, since three AC terminals, a P terminal, and an N terminal are all fixed to the lead frame only at their entrance parts, an end of each terminal drops by the self-weight and joining is made with insufficient solder, so that the solder strength is lowered or solder spills, and since terminal displacement and the amount of solder on each switching element cannot be absorbed due to the structure, terminal position displacement and terminal connection failure occur. In addition, an end of each AC terminal is connected to a heat spreader for each phase on a low side via connection on an element, and an end of the N terminal is connected to an element on the left side via connection on an element at the center. Therefore, in addition to sporadic occurrence of solder joining failure on elements as described above, displacement of solder connection of an end passing another connection is not corrected and terminal displacement is expanded in addition to terminal displacement at the passed connection part, whereby terminal position displacement and terminal connection failure further occur. In addition, since the P terminal and the N terminal are led out as one pair in the longitudinal direction as shown in Non-Patent Document 1, it is considered that reduction of the one-turn Ls cannot be expected.

In Patent Document 2, the P terminals and the N terminals are led out in parallel from both of the left and right sides in the lateral direction, whereby the one-turn Ls can be reduced. However, since two pairs of three arms for three phases are arranged laterally, a length between lateral wiring terminals is four times as compared to a length in the longitudinal lead-out case where the route of the one-turn Ls on a one-arm basis is provided in the longitudinal direction as in Non-Patent Document 1. Therefore, even if the parasitic inductance is approximately halved by both-end connection, it is estimated that the one-turn Ls is approximately doubled as compared to the structure of Non-Patent Document 1. For example, by a parasitic mutual inductance based on a parallel flat-plate structure, the one-turn Ls can be canceled out to a certain extent. However, in wiring in the module, although a similar effect is present depending on the layout for either the longitudinal direction or the lateral direction, busbars led out from the P terminal and the N terminal need to be connected to respective elements at one or more locations while ensuring insulation between busbars and from elements. Therefore, the parasitic mutual inductance does not increase to such an extent that cancels out the whole parasitic self-inductance over the wiring length.

In Non-Patent Document 1, the P terminals and the N terminals are provided independently on a one-arm basis longitudinally in the short-side direction, whereby the one-turn Ls can be reduced. However, since 2in1 structures are arranged laterally to form three phases, the one-turn Ls is subjected to restriction of the main circuit length of one arm, and therefore the effect of reducing the one-turn Ls is small. In addition, control signals for six switching units are arranged in the long-side direction on the side opposite to the P terminal and the N terminal with AC terminals interposed therebetween, and the three AC terminals and the control signal group for six switching units become length constraints on the long-side side, thus hampering size reduction of the semiconductor device.

SUMMARY

Accordingly, an object of the present disclosure is to provide a semiconductor device which is downsized and enables reduction of the one-turn Ls while suppressing terminal position displacement and terminal connection failure, and a manufacturing method therefor.

A semiconductor device according to the present disclosure includes: a first conductive plate formed in a plate shape of which a width in a second direction perpendicular to a first direction is smaller than a width in the first direction; a second conductive plate, a third conductive plate, and a fourth conductive plate located on one side in the second direction of the first conductive plate with an interval therebetween and arranged at intervals from one side to another side in the first direction, on the same plane as the first conductive plate; three first switching elements which are arranged at intervals from the one side to the other side in the first direction on one surface of the first conductive plate, and of which other surfaces are connected to the one surface of the first conductive plate; three second switching elements of which other surfaces are connected respectively to one surface of each of the second conductive plate, the third conductive plate, and the fourth conductive plate; a first conductor extending in the first direction and connected to one surface of each of the three second switching elements; a second conductor connecting the one surface of the second conductive plate and one surface of the first switching element located on the one side in the first direction; a third conductor connecting the one surface of the third conductive plate and one surface of the first switching element located at a center in the first direction; a fourth conductor connecting the one surface of the fourth conductive plate and one surface of the first switching element located on the other side in the first direction; as control terminals, three sets of first control terminals located on another side in the second direction of the first conductive plate with an interval therebetween, and connected respectively to the three first switching elements; as the control terminals, three sets of second control terminals located respectively on the one side in the second direction of each of the second conductive plate, the third conductive plate, and the fourth conductive plate with an interval therebetween, and connected respectively to the three second switching elements; as AC terminals, three second AC terminals connected respectively to the one surface of each of the second conductive plate, the third conductive plate, and the fourth conductive plate on the one side in the second direction, and extending toward the one side in the second direction relative to the second conductive plate, the third conductive plate, and the fourth conductive plate; as the AC terminals, three first AC terminals extending respectively from the second conductor, the third conductor, and the fourth conductor toward the other side in the second direction relative to the first conductive plate; as an N terminal, one or both of a first N terminal extending from the first conductor toward the one side in the first direction relative to the second conductive plate and a second N terminal extending from the first conductor toward the other side in the first direction relative to the fourth conductive plate; as a P terminal, one or both of a first P terminal connected to the one surface of the first conductive plate on the one side in the first direction and extending toward the one side in the first direction relative to the first conductive plate, and a second P terminal connected to the one surface of the first conductive plate on the other side in the first direction and extending toward the other side in the first direction relative to the first conductive plate; a first dummy terminal extending from the second conductor toward the one side in the first direction relative to the first conductive plate; a second dummy terminal extending from the fourth conductor toward the other side in the first direction relative to the first conductive plate; and a third dummy terminal extending from the third conductor through between the third conductive plate and the fourth conductive plate toward the one side in the second direction, and connected to the second AC terminal connected to the third conductive plate. In a state in which ends of the first dummy terminal, the second dummy terminal, the first control terminals, the second control terminals, the first AC terminals, the second AC terminals, the N terminal, and the P terminal are exposed, the first conductive plate, the second conductive plate, the third conductive plate, the fourth conductive plate, the first switching elements, the second switching elements, the first conductor, the second conductor, the third conductor, and the fourth conductor are sealed by a resin member.

A manufacturing method for a semiconductor device according to the present disclosure includes: a member preparing step of preparing a first conductive plate formed in a plate shape of which a width in a second direction perpendicular to a first direction is smaller than a width in the first direction, a second conductive plate, a third conductive plate, a fourth conductive plate, three first switching elements, three second switching elements, a first conductor extending in one direction and having a first N terminal provided at one end and a second N terminal provided at another end, and a lead frame including an enclosing-shape frame and a plurality of in-frame terminals which are three second AC terminals, a second conductor to which a first AC terminal and a first dummy terminal are provided, a third conductor to which a first AC terminal and a third dummy terminal connected to one of the second AC terminals are provided, a fourth conductor to which a first AC terminal and a second dummy terminal are provided, three sets of first control terminals, three sets of second control terminals, a first P terminal, and a second P terminal, the in-frame terminals being located on an inner side of the frame, the in-frame terminals being formed integrally with the frame; a first connection step of locating the second conductive plate, the third conductive plate, and the fourth conductive plate on one side in the second direction of the first conductive plate with an interval therebetween and arranging the second conductive plate, the third conductive plate, and the fourth conductive plate at intervals from one side to another side in the first direction, on the same plane as the first conductive plate, arranging the three first switching elements at intervals from the one side to the other side in the first direction on one surface of the first conductive plate, connecting other surfaces of the three first switching elements to the one surface of the first conductive plate, and connecting other surfaces of the three second switching elements respectively to one surface of each of the second conductive plate, the third conductive plate, and the fourth conductive plate; a second connection step of moving the lead frame so that the first conductive plate, the second conductive plate, the third conductive plate, and the fourth conductive plate are placed within the inner side of the frame, in a state in which the lead frame is located so that the three first AC terminals extend toward another side in the second direction relative to the first conductive plate, the first dummy terminal extends toward the one side in the first direction relative to the first conductive plate, the second dummy terminal extends toward the other side in the first direction relative to the first conductive plate, and the third dummy terminal extends through between the third conductive plate and the fourth conductive plate toward the one side in the second direction, connecting another surface of the second conductor and one surface of the first switching element located on the one side in the first direction to each other, connecting another surface of the third conductor and one surface of the first switching element located at a center in the first direction to each other, connecting another surface of the fourth conductor and one surface of the first switching element located on the other side in the first direction to each other, connecting an end of a part of the second conductor extending toward the one side in the second direction and the one surface of the second conductive plate on the other side in the second direction to each other, connecting an end of a part of the third conductor extending toward the one side in the second direction and the one surface of the third conductive plate on the other side in the second direction to each other, and connecting an end of a part of the fourth conductor extending toward the one side in the second direction and the one surface of the fourth conductive plate on the other side in the second direction to each other, in a state in which the lead frame is located so that the first P terminal extends toward the one side in the first direction relative to the first conductive plate, connecting the first P terminal to the one surface of the first conductive plate on the one side in the first direction, in a state in which the lead frame is located so that the second P terminal extends toward the other side in the first direction relative to the first conductive plate, connecting the second P terminal to the one surface of the first conductive plate on the other side in the first direction, in a state in which the lead frame is located so that the three second AC terminals extend toward the one side in the second direction relative to the second conductive plate, the third conductive plate, and the fourth conductive plate, connecting ends on the other side in the second direction of the three second AC terminals respectively to the one surface of each of the second conductive plate, the third conductive plate, and the fourth conductive plate on the one side in the second direction, in a state in which the lead frame is located so that the three sets of first control terminals are located on the other side in the second direction of the first conductive plate with an interval therebetween, connecting the three sets of first control terminals respectively to the three first switching elements, and in a state in which the lead frame is located so that the three sets of second control terminals are located respectively on the one side in the second direction of each of the second conductive plate, the third conductive plate, and the fourth conductive plate with an interval therebetween, connecting the three sets of second control terminals respectively to the three second switching elements; a third connection step of, in a state in which the first conductor is located on the three second switching elements so as to extend in the first direction, the first N terminal extends from the first conductor toward the one side in the first direction relative to the second conductive plate, and the second N terminal extends from the first conductor toward the other side in the first direction relative to the fourth conductive plate, connecting another surface of the first conductor and one surface of each of the three second switching elements to each other; a sealing step of, in a state in which ends of the first dummy terminal, the second dummy terminal, the first control terminals, the second control terminals, the first AC terminals, the second AC terminals, the first N terminal, the second N terminal, the first P terminal, and the second P terminal are exposed, sealing the first conductive plate, the second conductive plate, the third conductive plate, the fourth conductive plate, the first switching elements, the second switching elements, the first conductor, the second conductor, the third conductor, and the fourth conductor by a resin member; and a cutting step of cutting parts on the frame side of the first dummy terminal, the second dummy terminal, the first control terminals, the second control terminals, the first AC terminals, the second AC terminals, the first P terminal, and the second P terminal.

The semiconductor device according to the present disclosure includes the first dummy terminal, the second dummy terminal, and the third dummy terminal, and in a state in which the ends of the first dummy terminal, the second dummy terminal, the first control terminals, the second control terminals, the first AC terminals, the second AC terminals, the N terminal, and the P terminal are exposed, the first conductive plate, the second conductive plate, the third conductive plate, the fourth conductive plate, the first switching elements, the second switching elements, the first conductor, the second conductor, the third conductor, and the fourth conductor are sealed by the resin member. Therefore, the ends of the second conductor, the third conductor, and the fourth conductor do not droop toward the switching element side by self-weights during manufacturing. Thus, position displacement of the second conductor, the third conductor, and the fourth conductor which are terminals connected to the switching elements can be suppressed. In addition, since the ends of the second conductor, the third conductor, and the fourth conductor do not droop toward the switching element side by self-weights, solder void, solder insufficiency, and solder spill are suppressed at the time of connecting them to the switching elements by brazing means such as solder. Thus, connection failure of the second conductor, the third conductor, and the fourth conductor which are terminals connected to the switching elements can be suppressed. In addition, since both of the P terminal and the N terminal are provided so as to be exposed from the insulation member in the first direction, the one-turn Ls can be reduced. In addition, the length in the first direction of the semiconductor device is determined by the three AC terminals and the three sets of control terminals. Therefore, as compared to the conventional example in which the three AC terminals and the control signal group for six switching units are located on the long-side side, the length corresponding to three sets of control terminals is eliminated, whereby the semiconductor device can be downsized.

In the manufacturing method for the semiconductor device according to the present disclosure, each of the second conductor, the third conductor, and the fourth conductor is connected to the frame at least at two locations. Therefore, the ends of the second conductor, the third conductor, and the fourth conductor do not droop toward the switching element side by self-weights during manufacturing in a state in which they are connected to the frame. Thus, position displacement of the second conductor, the third conductor, and the fourth conductor which are terminals connected to the switching elements can be suppressed. In addition, since the ends of the second conductor, the third conductor, and the fourth conductor do not droop toward the switching element side by self-weights, solder void, solder insufficiency, and solder spill are suppressed at the time of connecting them to the switching elements by brazing means such as solder. Thus, connection failure of the second conductor, the third conductor, and the fourth conductor which are terminals connected to the switching elements can be suppressed. In addition, since both of the P terminal and the N terminal are provided so as to be exposed from the insulation member in the first direction, the one-turn Ls can be reduced. In addition, the length in the first direction of the semiconductor device is determined by the three AC terminals and the three sets of control terminals. Therefore, as compared to the conventional example in which the three AC terminals and the control signal group for six switching units are located on the long-side side, the length corresponding to three sets of control terminals is eliminated, whereby the semiconductor device can be downsized.

BRIEF DESCRIPTION OF THE DRAWINGS

FIG. 3 shows wiring pattern types in the semiconductor device according to the first embodiment and a comparative example;

FIG. 4 shows parasitic inductance coefficients in the semiconductor device according to the first embodiment and the comparative example;

FIG. 8 shows an analysis result for the semiconductor device according to the first embodiment and the comparative example;

DETAILED DESCRIPTION OF THE PREFERRED

Figure 1:
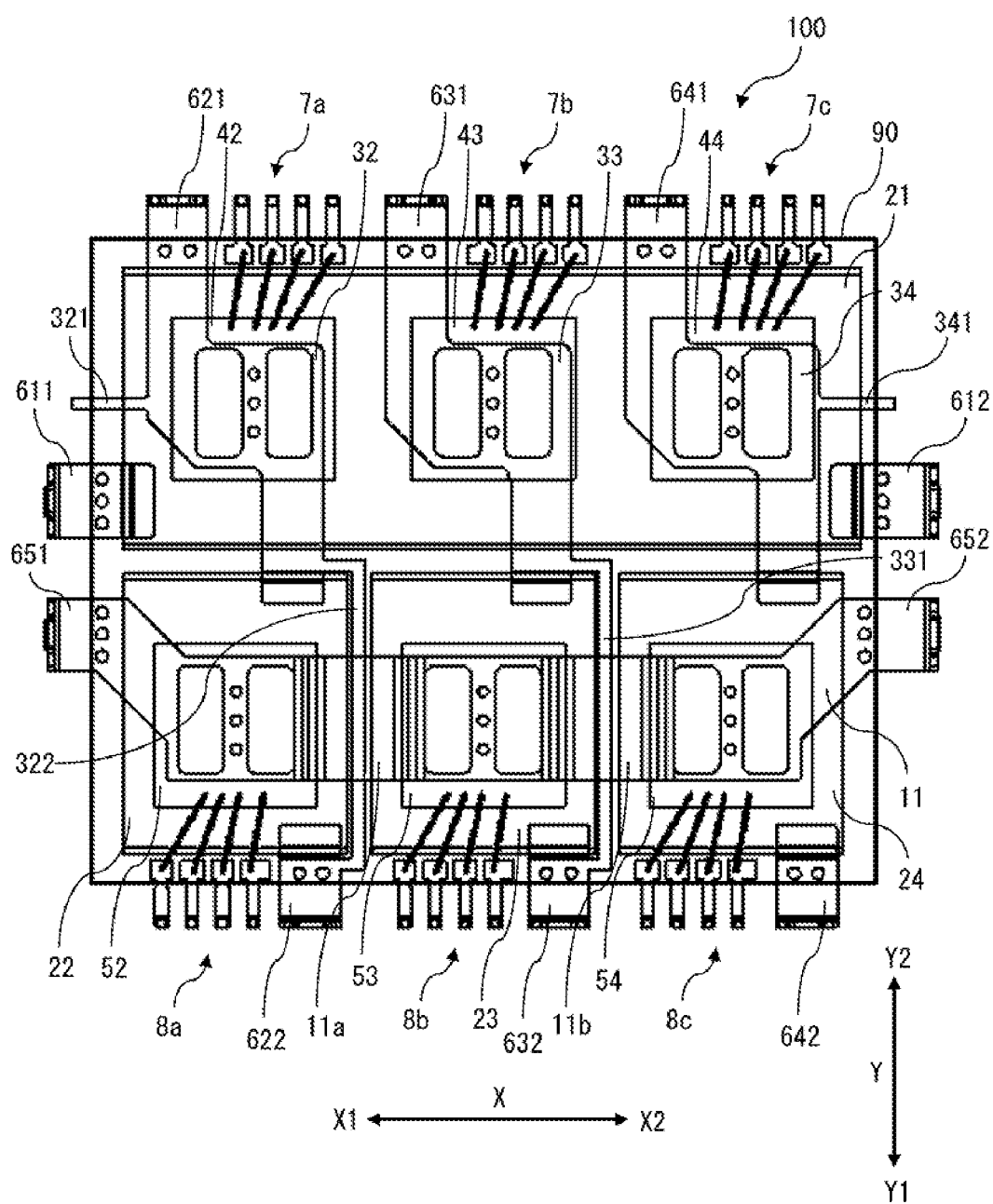
FIG. 1 is a plan view schematically showing a semiconductor device according to the first embodiment of the present disclosure.

Hereinafter, a semiconductor device and a manufacturing method therefor according to embodiments of the present disclosure will be described with reference to the drawings. In the drawings, the same or corresponding members and parts are denoted by the same reference characters, to give description.

First Embodiment

Figure 2:
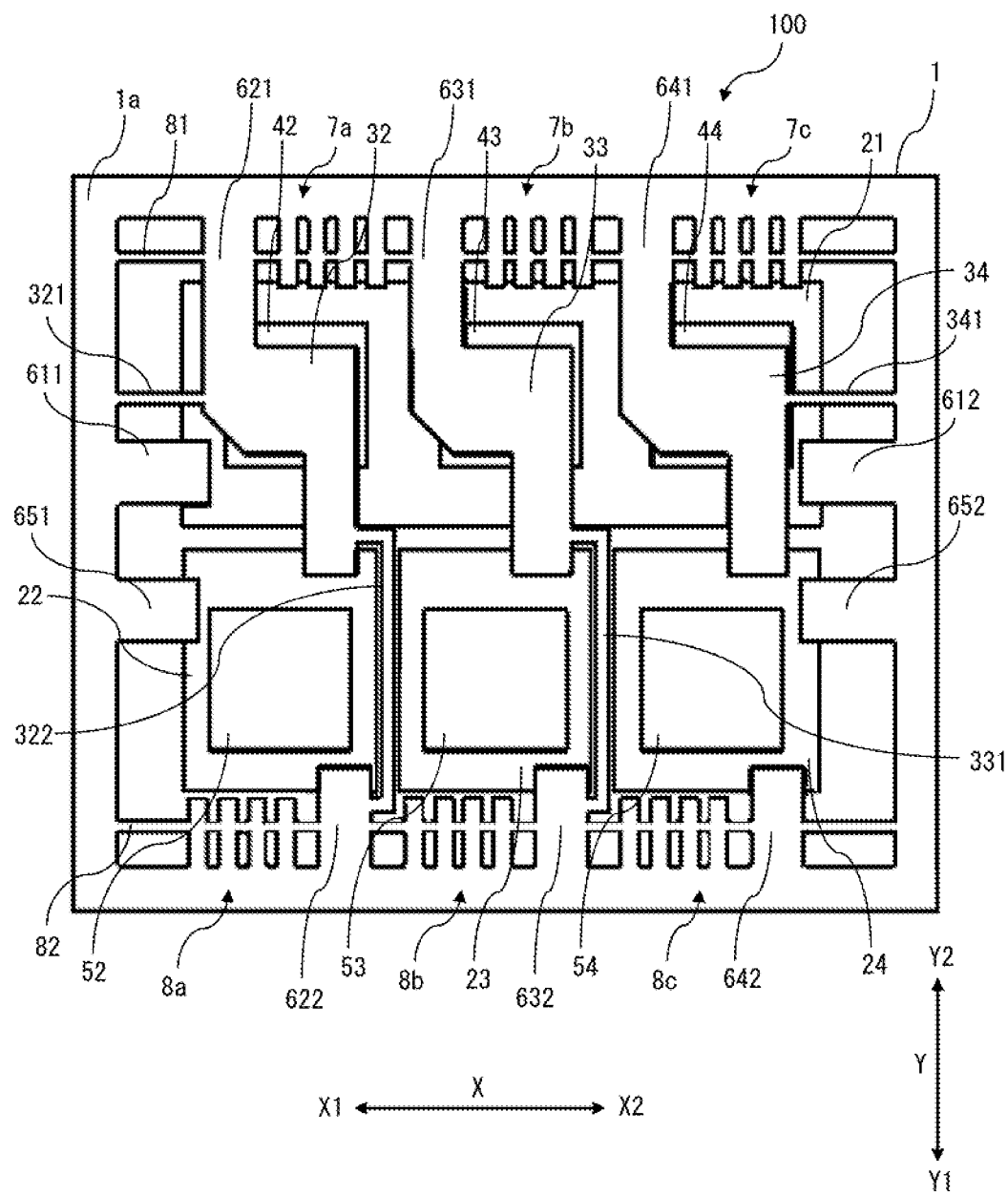
FIG. 2 shows a layout of a lead frame of the semiconductor device according to the first embodiment.
Figure 5:
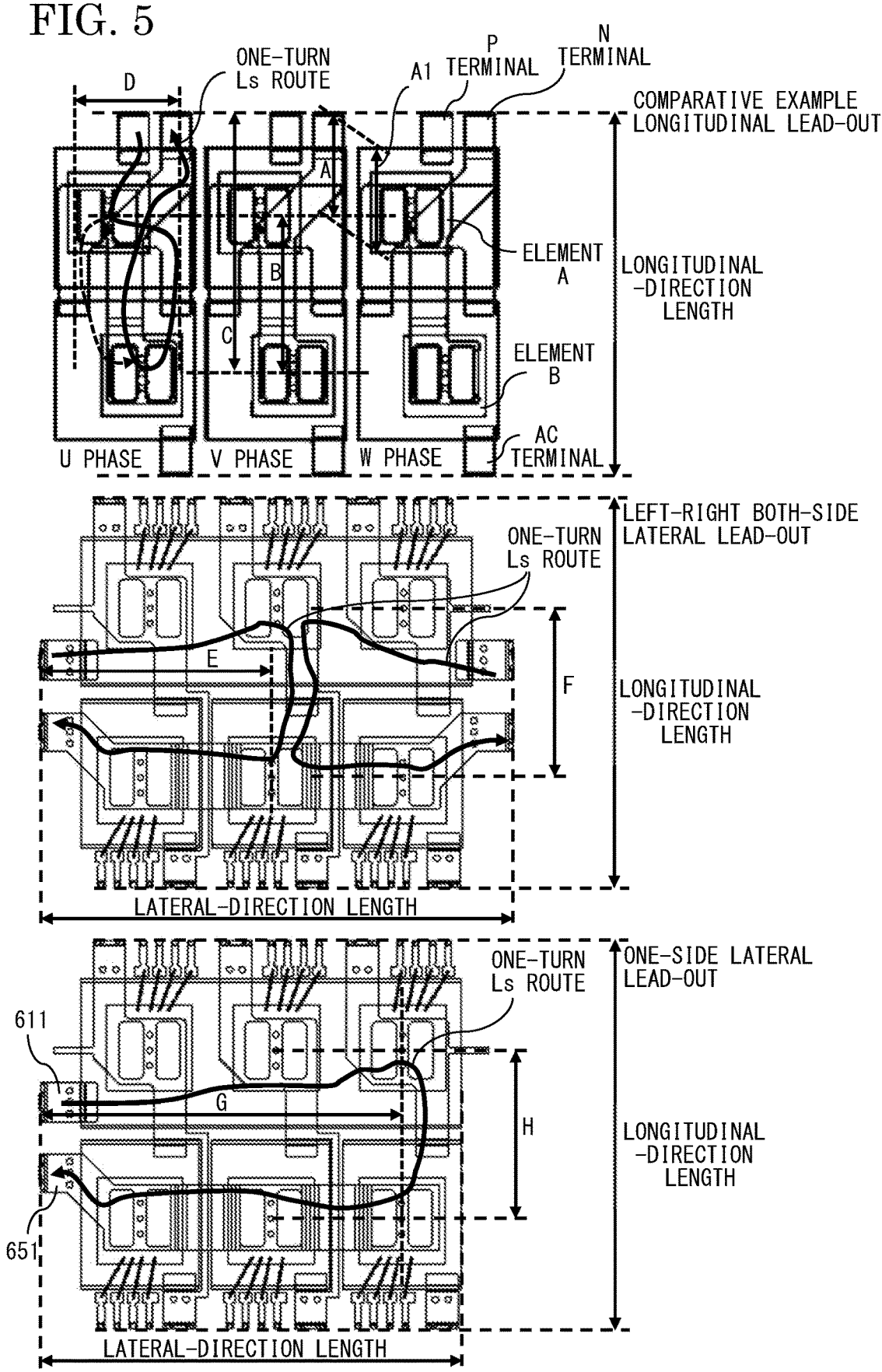
FIG. 5 illustrates, by comparison, one-turn Ls in the semiconductor device according to the first embodiment and the comparative example.
Figure 6:
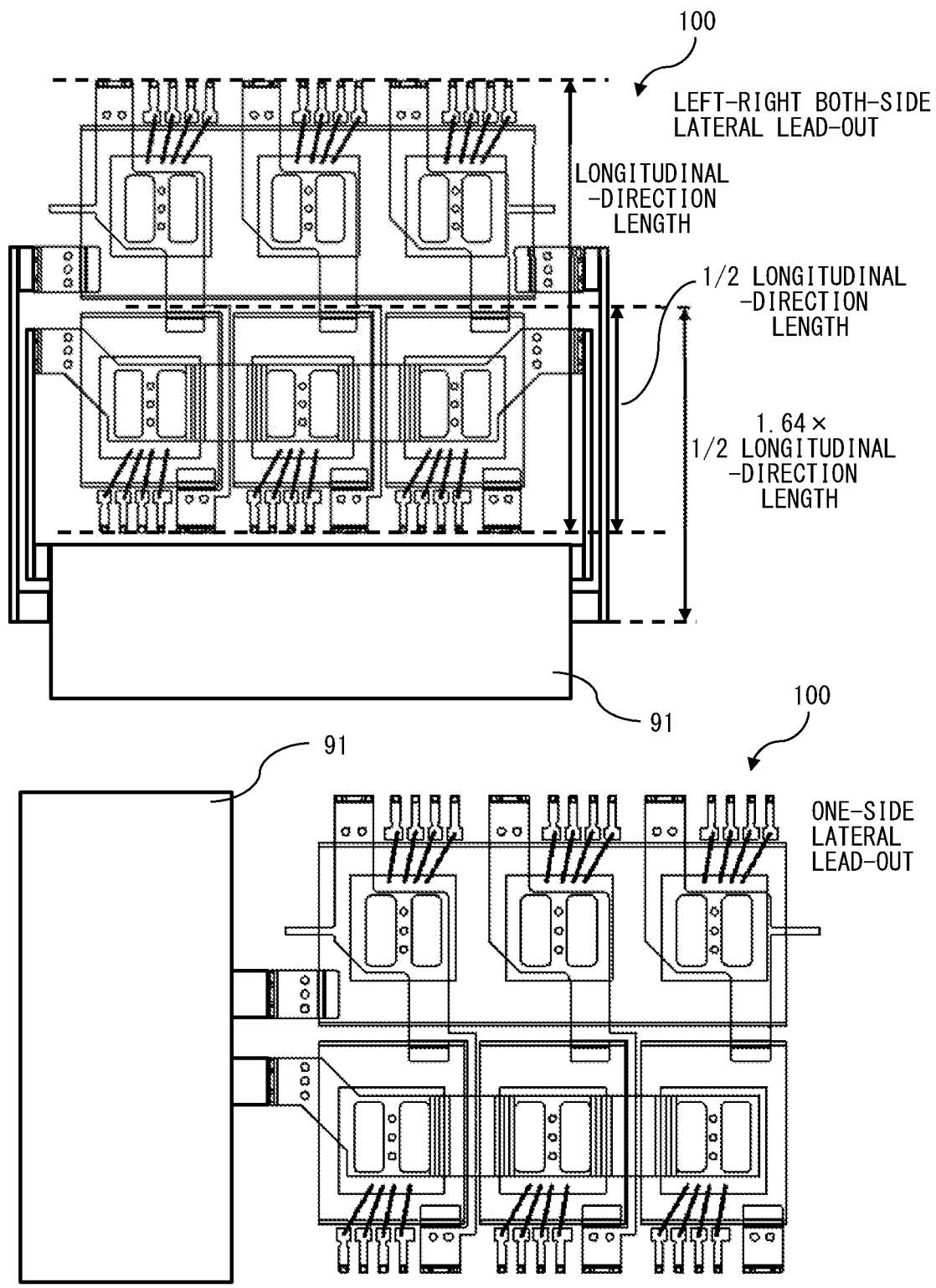
FIG. 6 illustrates a connection manner of the semiconductor device according to the first embodiment and a capacitor module.
Figure 7:
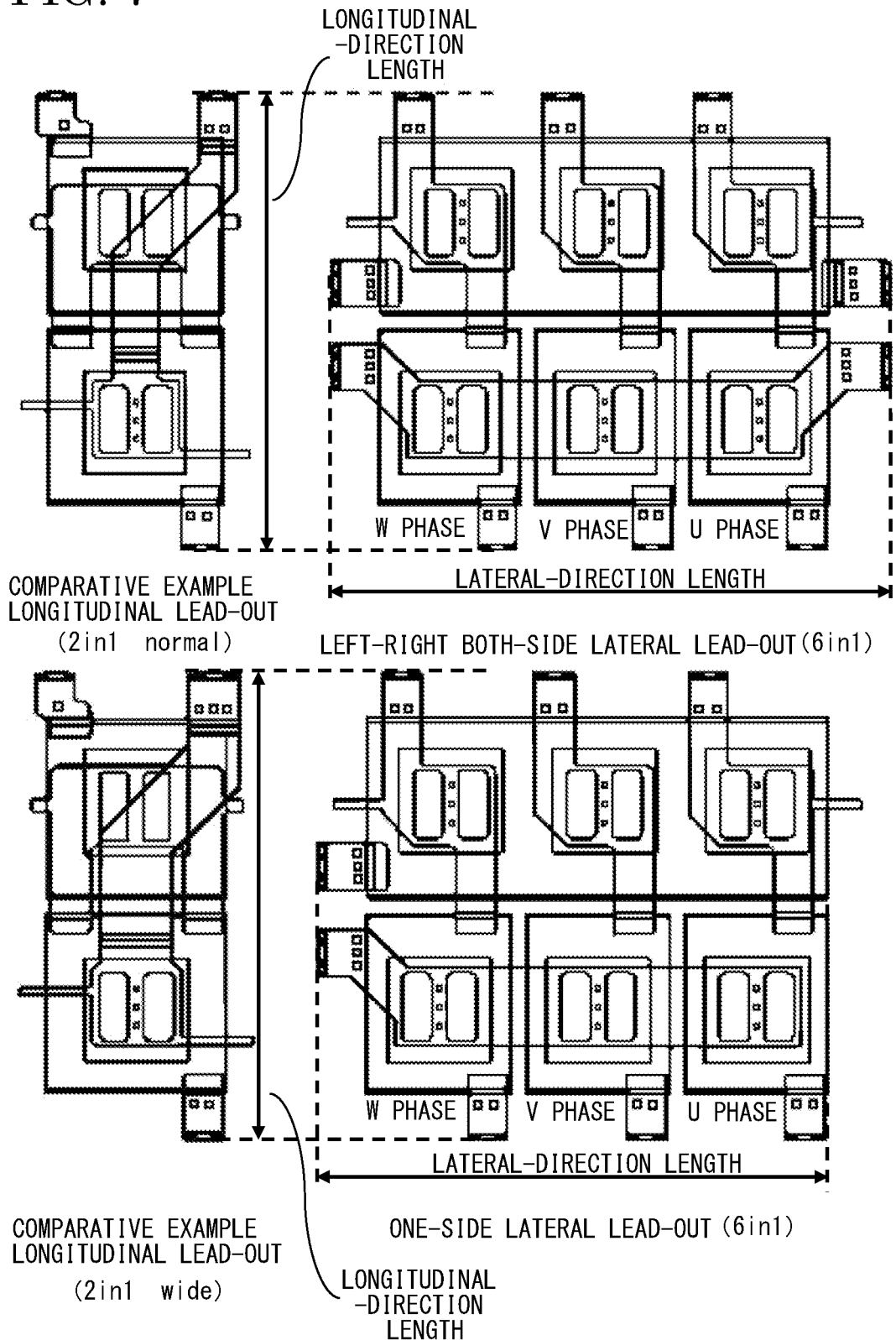
FIG. 7 shows 3D model data used in analysis for the semiconductor device according to the first embodiment and the comparative example.
Figure 9:
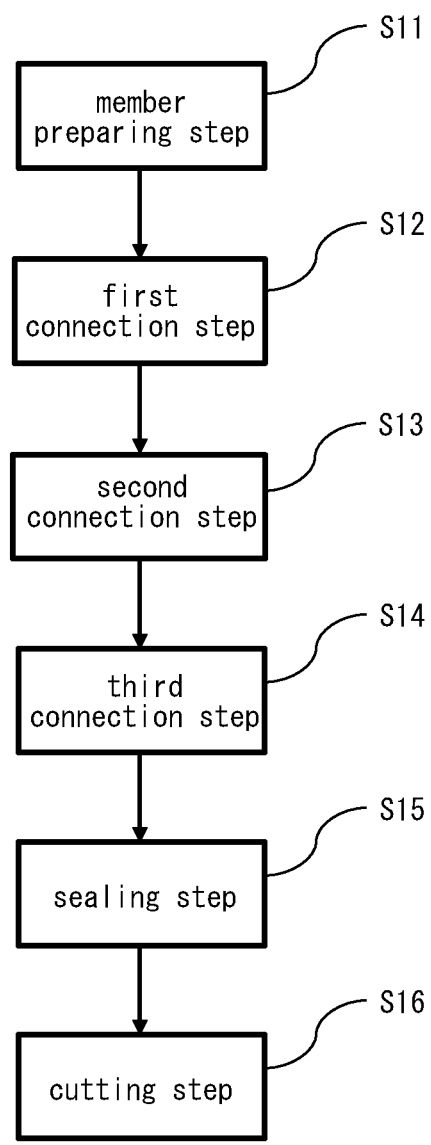
FIG. 9 shows a manufacturing process for the semiconductor device according to the first embodiment.

FIG. 1 is a plan view schematically showing a semiconductor device 100 according to the first embodiment, in which a resin member 90 is shown by only its outer shape and conductors are shown transparently. FIG. 2 shows a layout of a lead frame 1 of the semiconductor device 100, and shows the layout forms of switching elements and conductive plates. FIG. 3 shows wiring pattern types in the semiconductor device 100 and a comparative example. FIG. 4 shows parasitic inductance coefficients in the semiconductor device 100 and the comparative example. FIG. 5 illustrates, by comparison, one-turn Ls in the semiconductor device 100 and the comparative example. FIG. 6 illustrates a connection manner of the semiconductor device 100 and a capacitor module 91. FIG. 7 shows 3D model data used in analysis for the semiconductor device 100 and the comparative example. FIG. 8 shows an analysis result for the semiconductor device 100 and the comparative example. FIG. 9 shows a manufacturing process for the semiconductor device 100. The semiconductor device 100 is, for example, a device for converting input current from DC to AC or from AC to DC or for converting input voltage to different voltage.

<Semiconductor Device 100>

The semiconductor device according to the present disclosure is technology that relates to n arms for n phases. Here, the semiconductor device 100 having a three-phase three-arm configuration which is most versatile will be described. The three arms for three phases are formed for six switching units using a switching element group including a plurality of switching elements such as MOSFETs, RC-IGBTs, or IGBTs and diodes, and the three arms for three phases are stored in one semiconductor device 100. By storing the three arms for three phases in one semiconductor device 100 and downsizing the semiconductor device 100 with an increased power density, a one-turn loop inductance (hereinafter, referred to as one-turn Ls) parasitic in a power main circuit having an arm configuration and serving as a source for generating high-frequency noise is reduced, and the member amounts of a resin member, a conductive plate, and a lead frame composing the semiconductor device 100 are reduced, whereby the cost for the semiconductor device 100 is reduced.

The configuration of the semiconductor device 100 will be described. As shown in FIG. 1, the semiconductor device 100 includes a first conductive plate 21, a second conductive plate 22, a third conductive plate 23, and a fourth conductive plate 24 which are heat spreaders. The heat spreaders are made from a highly conductive metal material such as copper. The first conductive plate 21 is formed in a plate shape of which a width in a second direction perpendicular to a first direction is smaller than a width in the first direction. In the drawings, the first direction is defined as an arrow X, one side in the first direction is denoted by X1, and another side in the first direction is denoted by X2. In addition, the second direction is defined as an arrow Y, one side in the second direction is denoted by Y1, and another side in the second direction is denoted by Y2. The second conductive plate 22, the third conductive plate 23, and the fourth conductive plate 24 are located on the one side in the second direction of the first conductive plate 21 with an interval therebetween and arranged at intervals from the one side to the other side in the first direction, on the same plane as the first conductive plate 21. In the present embodiment, the length in the first direction and the length in the second direction of each of the second conductive plate 22, the third conductive plate 23, and the fourth conductive plate 24 are equivalent.

The semiconductor device 100 includes three first switching elements and three second switching elements. A first switching element 42 and a second switching element 52 form W phase, a first switching element 43 and a second switching element 53 form V phase, and a first switching element 44 and a second switching element 54 form U phase. The first switching elements 42, 43, 44 are arranged at intervals from the one side to the other side in the first direction on one surface of the first conductive plate 21, and other surfaces of the first switching elements 42, 43, 44 are connected to the one surface of the first conductive plate 21. The first switching elements 42, 43, 44 are provided respectively near the centers of three parts divided in the first direction on the first conductive plate 21. Such arrangement is for enhancing heat dissipation of the elements. Other surfaces of the second switching elements 52, 53, 54 are connected respectively to one surface of each of the second conductive plate 22, the third conductive plate 23, and the fourth conductive plate 24. The second switching elements 52, 53, 54 are provided respectively near the center of each of the second conductive plate 22, the third conductive plate 23, and the fourth conductive plate 24. Such arrangement is for enhancing heat dissipation of the elements. For connection between the switching elements and the heat spreaders, solder is used, for example.

Each of the first switching elements 42, 43, 44 and the second switching elements 52, 53, 54 is composed of one element of a reverse conducting IGBT (RC-IGBT) or a metal oxide semiconductor field effect transistor (MOSFET) which is a power control semiconductor element formed from a silicon semiconductor element or a wide bandgap semiconductor element. In the present embodiment, an RC-IGBT is used. With this configuration, since each of the first switching elements 42, 43, 44 and the second switching elements 52, 53, 54 is provided as one element, the semiconductor device 100 can be downsized. In addition, in a case of using the wide bandgap semiconductor element, a temporal change amount di/dt of current generated in switching can be increased as compared to an element formed from silicon. In addition, since the wide bandgap semiconductor element is small in ON resistance, high in tolerable current density, low in power loss, and small in heat generation, the chip area can be reduced. Since the chip area is reduced, the semiconductor device 100 can be downsized.

Figure 10:
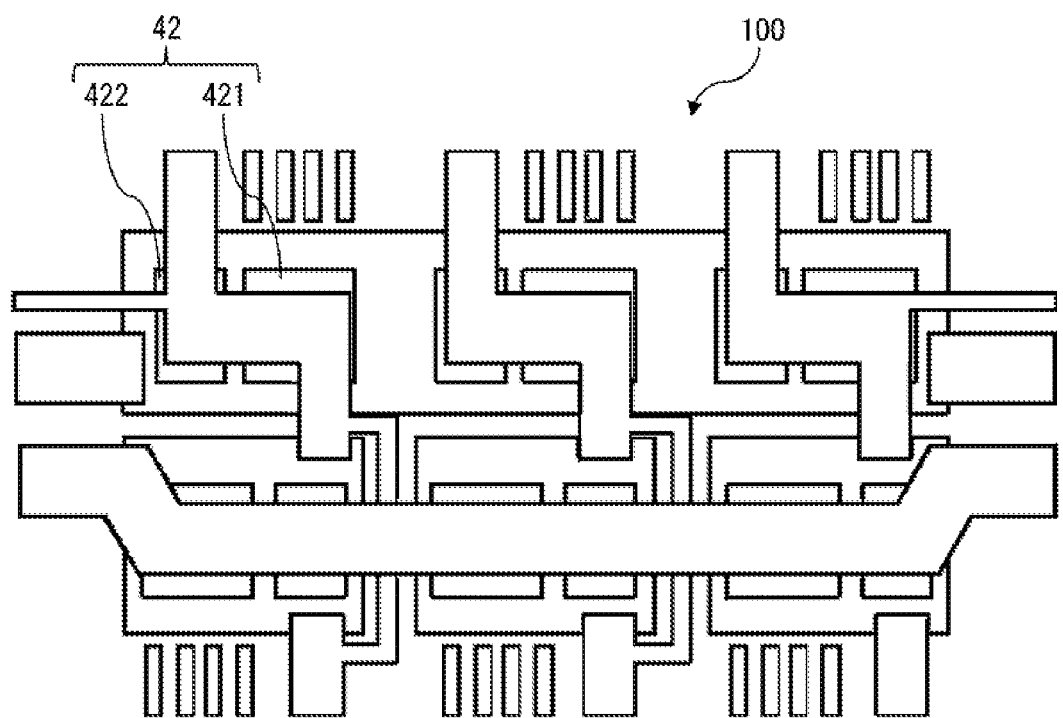
FIG. 10 is a plan view schematically showing another semiconductor device according to the first embodiment.

The configuration of the first switching elements 42, 43, 44 and the second switching elements 52, 53, 54 is not limited to the above. As shown in FIG. 10, each of them may be composed of a plurality of elements including an insulated gate bipolar transistor (IGBT) and a diode formed from a silicon semiconductor element or a wide bandgap semiconductor element. FIG. 10 is a plan view schematically showing another semiconductor device 100 according to the first embodiment, in which the resin member 90 is removed. The first switching element 42 is composed of an IGBT 421 and a diode 422. With this configuration, if any of the switching elements is a defective product, only one element may be replaced, and thus productivity of the semiconductor device 100 can be improved. In the present embodiment, the elements composing the switching element are arranged in the first direction. However, without limitation thereto, the elements may be arranged in the second direction. In addition, the switching element may be composed of even more elements.

The semiconductor device 100 includes a first conductor 11, and one or both of a first N terminal 651 and a second N terminal 652 as N terminals. The first conductor 11 which is a lead frame extends in the first direction and is connected to one surface of each of the second switching elements 52, 53, 54. The first N terminal 651 extends from the first conductor 11 toward the one side in the first direction relative to the second conductive plate 22. The second N terminal 652 extends from the first conductor 11 toward the other side in the first direction relative to the fourth conductive plate 24. In the structure (left-right both-side lateral lead-out structure) shown in FIG. 1 in the present embodiment, the semiconductor device 100 includes both of the first N terminal 651 and the second N terminal 652. As shown in the lower view in FIG. 5, the semiconductor device 100 may have a structure (one-side lateral lead-out structure) including only the first N terminal 651. In order to avoid contact with a third dummy terminal 331 and a fourth dummy terminal 322 described later, the first conductor 11 has protrusions 11a, 11b protruding toward a side opposite to the second switching elements 52, 53, 54, as shown in FIG. 1.

The structure of the lead frame 1 will be described with reference to FIG. 2. The lead frame 1 includes a plurality of in-frame terminals and an enclosing-shape frame 1a. The in-frame terminals are located on the inner side of the frame 1a, and the in-frame terminals are formed integrally with the frame 1a. The plurality of in-frame terminals are second AC terminals 622, 632, 642, a second conductor 32 to which a first AC terminal 621, a first dummy terminal 321, and the fourth dummy terminal 322 connected to the second AC terminal 622 are provided, a third conductor 33 to which a first AC terminal 631 and the third dummy terminal 331 connected to the second AC terminal 632 are provided, a fourth conductor 34 to which a first AC terminal 641 and a second dummy terminal 341 are provided, three sets of first control terminals 7a, 7b, 7c, three sets of second control terminals 8a, 8b, 8c, a first P terminal 611, a second P terminal 612, the first N terminal 651, and the second N terminal 652. In the present embodiment, since the first N terminal 651 and the second N terminal 652 are provided to the first conductor 11, the first N terminal 651 and the second N terminal 652 as the in-frame terminals may not be provided. In a case where the first N terminal 651 and the second N terminal 652 are not provided to the first conductor 11, the first N terminal 651 and the second N terminal 652 as the in-frame terminals are provided, and the first N terminal 651 and the second N terminal 652, and the first conductor 11, are connected to each other.

Arrangement of the plurality of in-frame terminals on the inner side of the frame 1a and the details of the plurality of in-frame terminals will be described. The second conductor 32, the third conductor 33, and the fourth conductor 34 are arranged in the first direction on the other side in the second direction. The second conductor 32 connects the one surface of the second conductive plate 22 and one surface of the first switching element 42 located on the one side in the first direction. The third conductor 33 connects the one surface of the third conductive plate 23 and one surface of the first switching element 43 located at the center in the first direction. The fourth conductor 34 connects the one surface of the fourth conductive plate 24 and one surface of the first switching element 44 located on the other side in the first direction. The first AC terminals 621, 631, 641 as AC terminals extend respectively from the second conductor 32, the third conductor 33, and the fourth conductor 34 toward the other side in the second direction relative to the first conductive plate 21. The first dummy terminal 321 extends from the second conductor 32 toward the one side in the first direction relative to the first conductive plate 21. The second dummy terminal 341 extends from the fourth conductor 34 toward the other side in the first direction relative to the first conductive plate 21. The second conductor 32 is connected to the frame 1a at ends of the first AC terminal 621 and the first dummy terminal 321 provided to the second conductor 32. The third conductor 33 is connected to the frame 1a at an end of the first AC terminal 631 provided to the third conductor 33. The fourth conductor 34 is connected to the frame 1a at ends of the first AC terminal 641 and the second dummy terminal 341 provided to the fourth conductor 34.

The semiconductor device 100 includes one or both of the first P terminal 611 and the second P terminal 612 as P terminals which are the in-frame terminals. The semiconductor device 100 shown in FIG. 1 includes both of the first P terminal 611 and the second P terminal 612. As shown in the lower view in FIG. 5, the semiconductor device 100 may include only the first P terminal 611. As shown in FIG. 2, the first P terminal 611 is connected to the one surface of the first conductive plate 21 on the one side in the first direction, and extends toward the one side in the first direction relative to the first conductive plate 21. The second P terminal 612 is connected to the one surface of the first conductive plate 21 on the other side in the first direction, and extends toward the other side in the first direction relative to the first conductive plate 21. The first P terminal 611 and the first N terminal 651 are connected to the frame 1a at ends on the one side in the first direction. The second P terminal 612 and the second N terminal 652 are connected to the frame 1a at ends on the other side in the first direction. The P terminals and the N terminals are power supply terminals connected to a power supply outside.

As shown in FIG. 1, the semiconductor device 100 includes the three sets of first control terminals 7a, 7b, 7c and the three sets of second control terminals 8a, 8b, 8c, as control terminals which are the in-frame terminals. The first control terminals 7a, 7b, 7c are located on the other side in the second direction of the first conductive plate 21 with an interval therebetween, and are connected respectively to the three first switching elements 42, 43, 44. The second control terminals 8a, 8b, 8c are located respectively on the one side in the second direction of each of the second conductive plate 22, the third conductive plate 23, and the fourth conductive plate 24 with an interval therebetween, and are connected respectively to the three second switching elements 52, 53, 54. In the present embodiment, the number of the control terminals for one set is four. However, the number of the control terminals is not limited thereto. As shown in FIG. 2, the first control terminals 7a, 7b, 7c are connected to the frame 1a at ends on the other side in the second direction, and the second control terminals 8a, 8b, 8c are connected to the frame 1a at ends on the one side in the second direction. The control terminals and the switching elements are connected by wire bonding, for example.

The semiconductor device 100 includes three second AC terminals 622, 632, 642 as AC terminals which are the in-frame terminals. The second AC terminals 622, 632, 642 are connected respectively to the one surface of each of the second conductive plate 22, the third conductive plate 23, and the fourth conductive plate 24 on the one side in the second direction, and extend toward the one side in the second direction relative to the second conductive plate 22, the third conductive plate 23, and the fourth conductive plate 24. The second AC terminals 622, 632, 642 are connected to the frame 1a at ends on the one side in the second direction. The semiconductor device 100 includes both of the first AC terminal and the second AC terminal, but either one may be selected and used.

The semiconductor device 100 includes the third dummy terminal 331 and the fourth dummy terminal 322 as dummy terminals which are the in-frame terminals. The third dummy terminal 331 extends from the third conductor 33 through between the third conductive plate 23 and the fourth conductive plate 24 toward the one side in the second direction, and is connected to the second AC terminal 632 connected to the third conductive plate 23. The fourth dummy terminal 322 extends from the second conductor 32 through between the second conductive plate 22 and the third conductive plate 23 toward the one side in the second direction, and is connected to the second AC terminal 622 connected to the second conductive plate 22.

The lead frame 1 further includes dummy connection portions 81, 82. In FIG. 2, the dummy connection portion 81 connects the first control terminals 7a, 7b, 7c and the first AC terminals 621, 631, 641 in the first direction on the other side in the second direction of the first conductive plate 21. The dummy connection portion 81 is connected to the frame 1a on the one side and the other side in the first direction. In FIG. 2, the dummy connection portion 82 connects the second control terminals 8a, 8b, 8c and the second AC terminals 622, 632, 642 in the first direction on the one side in the second direction of the second conductive plate 22, the third conductive plate 23, and the fourth conductive plate 24. The dummy connection portion 82 is connected to the frame 1a on the one side and the other side in the first direction.

<Dummy Terminals and Dummy Connection Portions>

Effects obtained by providing the dummy terminals and the dummy connection portions will be described. The second conductor 32 is connected to the frame 1a at three locations of the first AC terminal 621, the first dummy terminal 321, and the second AC terminal 622 via the fourth dummy terminal 322. The third conductor 33 is connected to the frame 1a at two locations of the first AC terminal 631 and the second AC terminal 632 via the third dummy terminal 331. The fourth conductor 34 is connected to the frame 1a at two locations of the first AC terminal 641 and the second dummy terminal 341. As described above, each of the second conductor 32, the third conductor 33, and the fourth conductor 34 is connected to the frame 1a at least at two locations. Therefore, the ends of the second conductor 32, the third conductor 33, and the fourth conductor 34 do not droop toward the switching element side by self-weights during manufacturing in a state in which they are connected to the frame 1a.

Since the ends of the second conductor 32, the third conductor 33, and the fourth conductor 34 do not droop toward the switching element side by self-weights, position displacement of the second conductor 32, the third conductor 33, and the fourth conductor 34 which are terminals connected to the switching elements can be suppressed. In addition, since the ends of the second conductor 32, the third conductor 33, and the fourth conductor 34 do not droop toward the switching element side by self-weights, solder void, solder insufficiency, and solder spill can be suppressed at the time of connecting them to the switching elements by brazing means such as solder. Since solder void, solder insufficiency, and solder spill are suppressed, connection failure of the second conductor 32, the third conductor 33, and the fourth conductor 34 which are terminals connected to the switching elements can be suppressed.

The first control terminals 7a, 7b, 7c are connected to the frame 1a by the dummy connection portion 81, and the second control terminals 8a, 8b, 8c are connected to the frame 1a by the dummy connection portion 82. With this structure, at the time of connecting the first control terminals 7a, 7b, 7c and the second control terminals 8a, 8b, 8c to the switching elements, the positions of the first control terminals 7a, 7b, 7c and the second control terminals 8a, 8b, 8c are stabilized, whereby these control terminals can be easily connected to the switching elements. In addition, failure of connection between the switching elements, and the first control terminals 7a, 7b, 7c and the second control terminals 8a, 8b, 8c, can be suppressed.

Figure 11:
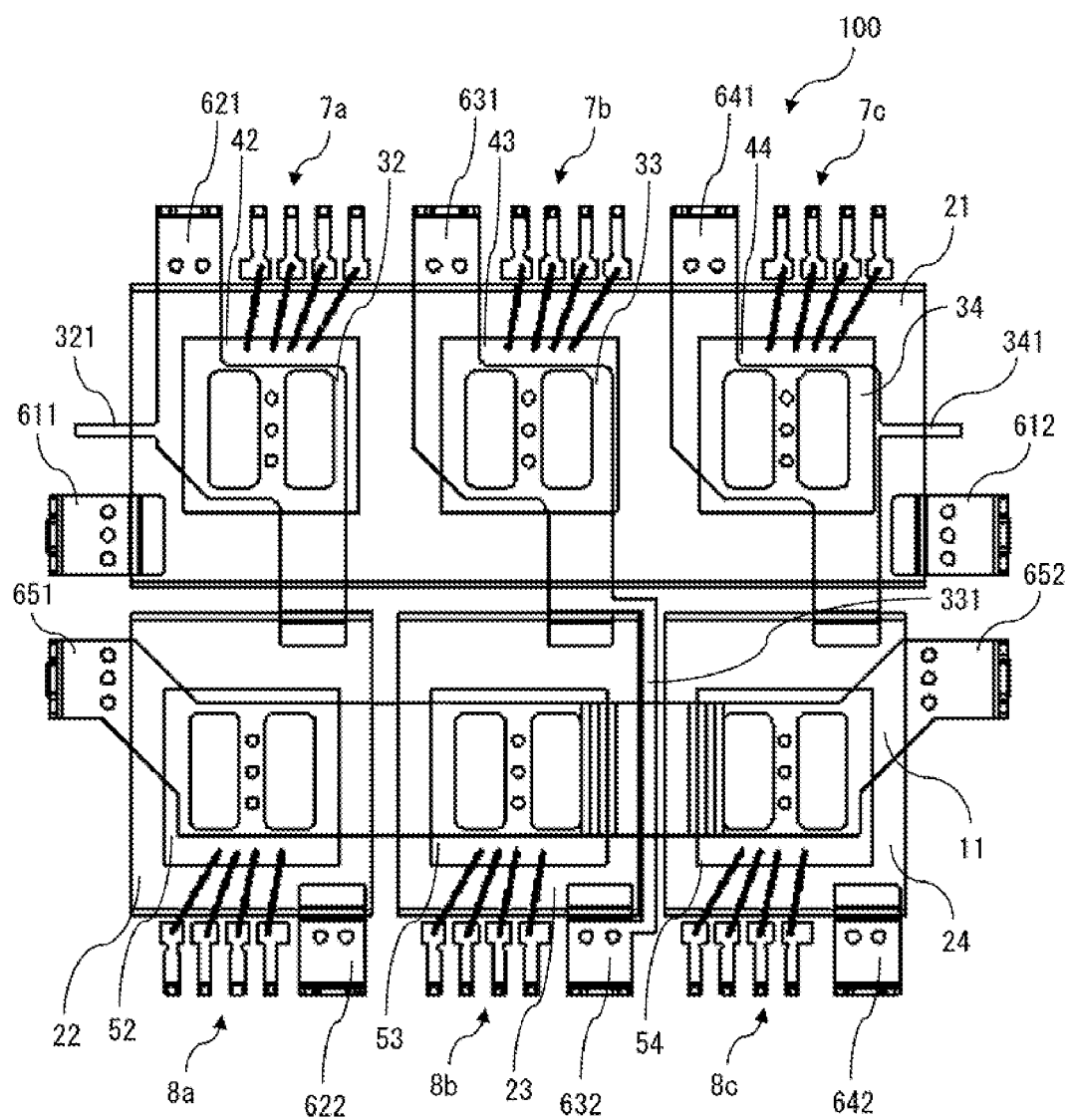
FIG. 11 is a plan view schematically showing still another semiconductor device according to the first embodiment.

For suppressing position displacement of each conductor, each conductor may be connected to the frame 1a at least at two locations. Therefore, as shown in FIG. 11, the fourth dummy terminal 322 connected to the second AC terminal 622 may not be provided. FIG. 11 is a plan view schematically showing still another semiconductor device 100 according to the first embodiment, in which the resin member 90 is removed and conductors are shown transparently. In a case of providing the fourth dummy terminal 322, position displacement of the second conductor 32 can be more suppressed.

In addition, since all the connection members excluding the first conductor 11 are formed with one lead frame 1 including the dummy terminals and the dummy connection portions, productivity of the semiconductor device 100 can be improved. In addition, the cost for the semiconductor device 100 can be reduced.

In addition, the length in the first direction of the semiconductor device 100 is determined by the three AC terminals and the three sets of control terminals. Therefore, as compared to the conventional example in which the three AC terminals and the control signal group for six switching units are located on the long-side side, the length corresponding to three sets of control terminals is eliminated, whereby the semiconductor device 100 can be downsized.

The structure of the lead frame 1 and formation of the terminals are summarized below. Ends, exposed from the resin member 90, of a plurality of target terminals which are the first dummy terminal 321, the second dummy terminal 341, the first control terminals 7a, 7b, 7c, the second control terminals 8a, 8b, 8c, the first AC terminals 621, 631, 641, the second AC terminals 622, 632, 642, and the P terminal, are formed integrally with the frame 1a enclosing the periphery around the plurality of target terminals, and parts on the frame 1a side of the plurality of target terminals are cutting portions to be cut. In a case where the lead frame 1 includes the dummy connection portions 81, 82, parts of the dummy connection portions 81, 82 to be cut so that the terminals connected to the dummy connection portions 81, 82 are provided independently of each other, are also cutting portions. Cutting the cutting portions makes the semiconductor device shown in FIG. 2 into the structure of the semiconductor device 100 shown in FIG. 1. By configuring the lead frame 1 as described above, since the ends of the second conductor 32, the third conductor 33, and the fourth conductor 34 do not droop toward the switching element side by self-weights, position displacement of the second conductor 32, the third conductor 33, and the fourth conductor 34 which are terminals connected to the switching elements can be suppressed.

<Reduction of One-Turn Ls>

Reduction of the one-turn Ls in the present disclosure will be described through comparison with the comparative example with reference to FIG. 5. In the structure of the present disclosure, both of the P terminal and the N terminal which are the power supply terminals are provided so as to be exposed from the insulation member in the first direction, and therefore the one-turn Ls can be reduced as compared to the conventional structure. Here, the dimensional structure of the semiconductor device 100 that can assuredly reduce the one-turn Ls will be described. The structure in which the P terminals and the N terminals in the three-phase 6in1 module are provided independently on a one-arm basis longitudinally in the short-side direction as shown in Non-Patent Document 1 is used as the comparative example. In the structure of the comparative example, since three identical structures are arranged, hereinafter, the structure of the comparative example is referred to as 2in1, whereas the structure of the present disclosure is referred to as 6in1. Under the assumption that the lengths in the second direction of the semiconductor device in the structure of the present disclosure and the semiconductor device in the comparative example are equal, the parasitic inductance will be described and then a result of parasitic inductance extraction analysis based on a 3D model will be presented.

A calculation formula for an inductance L of a straight conductor having a rectangular cross-section, shown in Non-Patent Document 2, is represented by Expression (1).

[Mathematical 1]

$$L = \frac{\mu l}{2\pi}\left(\ln\frac{2l}{a+b} + 0.5 + \frac{a+b}{3l}\right) \quad (1)$$

In Expression (1), a is the height, b is the width, and l is the length of the straight conductor. In addition, μ is permeability. The inductance L is proportional to the first power of the length l, and as the length l increases as compared to the height a and the width b, the proportional relationship of the length l in the inductance L is intensified. Owing to reduction of the self-inductance by locally expanding the width of wiring in the semiconductor device and the cancelation effect by the mutual inductance based on the parallel flat-plate structure of wiring, the parasitic inductance due to the one-turn Ls in the semiconductor device changes and thus the parasitic inductance is reduced.

Using the widths and the thicknesses of the conductive plates and the conductors in the semiconductor device and the lengths of wiring in the semiconductor device, the value in the parentheses of Expression (1) is calculated, and the calculated value is shown as a parasitic inductance coefficient in FIG. 3 and FIG. 4. Each wiring length is multiplied by the parasitic inductance coefficient, to approximate the parasitic inductance. In this approximation, the cancelation effect by the mutual inductance based on the parallel flat-plate structure of wiring is not reflected. If the basic structure, the relative positions of arranged elements, and the like are determined, the cancelation effect can also be made into a coefficient and it has been confirmed that a certain effect is obtained. However, the lead frame is routed in the semiconductor device and it is difficult to bring lead frame parts close to each other in parallel over a long distance. Therefore, the cancelation effect by the mutual inductance based on the parallel flat-plate structure can be omitted, and here, this cancelation effect is omitted. The value in the parentheses of Expression (1) is used as a coefficient, and the part other than the length l outside the parentheses is a constant. Therefore, the wiring length is multiplied by each coefficient in FIG. 4, to approximate the inductance value of each member.

In FIG. 5, the upper view is a view of the comparative example, the middle view is a view of the left-right both-side lateral lead-out structure for the power supply terminals in the present disclosure, and the lower view is a view of the one-side lateral lead-out structure for the power supply terminals in the present disclosure. The power supply terminals in the comparative example (2in1) are provided in the longitudinal direction and led out longitudinally in FIG. 5. Therefore, the route of the one-turn Ls of the parasitic inductance which is a major factor for high-frequency noise is formed in the longitudinal direction of the arm, and passes through the P terminal, the first switching element (high-side element, shown as element A in FIG. 5), the second switching element (low-side element, shown as element B in FIG. 5), and then the N terminal. Focusing on only the distance, this route has a length that is two times ¾ of the longitudinal-direction length in FIG. 5. In the lateral lead-out of the present disclosure (6in1), the route passing through the P terminal, the first switching element (high-side element), the second switching element (low-side element), and then the N terminal has the longest distance for the center arm because the power supply terminals are led out on both of the left and right sides, and becomes a route of making a round trip over ½ of the lateral-direction length. Regarding this route, a condition for reducing the one-turn Ls in the case of lateral lead-out of the power supply terminals is calculated. In comparison between the longitudinal lead-out and the lateral lead-out, calculation is performed under the condition that the longitudinal-direction lengths are equal, while, regarding the lateral-direction lengths, their respective lateral-direction lengths are used. In the present disclosure, the left-right both-side lateral lead-out and the one-side lateral lead-out of the power supply terminals are shown and each of these structures is used as a comparison target. This is because the total length in the lateral direction is greater in the longitudinal lead-out. In addition, even if the size of the body part of the device is the same between the left-right both-side lateral lead-out and the one-side lateral lead-out, the length in the lateral direction differs by the terminal length. Therefore, for one phase of the three phases in the longitudinal lead-out which is the comparison target, each lateral-direction route is changed to $3/10$ and $3/11$.

Calculation for the inductance L of each route in each structure will be shown below.

(Longitudinal Lead-Out)

From P terminal to first switching element: $k4 \times 1/4 \times$ longitudinal-direction length $1/4 \times$ longitudinal-direction length is represented by arrow A (the distance from the P terminal to the element A) in FIG. 5. The length of arrow A is equivalent to the length of arrow A1 (the current-conduction length from the conductive plate end to the element A).

From first switching element to second switching element: $k7 \times 1/2 \times$ longitudinal-direction length+$k6 \times (3/10$ or $3/11) \times$ lateral-direction length Here, $3/10$ is used for comparison with the one-side lateral lead-out and $3/11$ is used for comparison with the both-side lateral lead-out. The difference therebetween is provided because the lateral-direction length differs between the one-side lateral lead-out and the both-side lateral lead-out. In addition, since the width of the conductor is changed, the structure for $3/10$ is shown as "wide" and the structure for $3/11$ is shown as "normal" in the drawing. $1/2 \times$ longitudinal-direction length is represented by arrow B (the distance between the element A and the element B) in FIG. 5. $3/10 \times$ lateral-direction length is represented by arrow D (the length of the current route in the lateral direction) in FIG. 5.

From second switching element to N terminal: $k5 \times 3/4 \times$ longitudinal-direction length $3/4 \times$ longitudinal-direction length is represented by arrow C (the distance to the element B which is an element farther from the end) in FIG. 5.

(Left-Right Both-Side Lateral Lead-Out)

From P terminal to first switching element: $k1 \times 1/2 \times$ lateral-direction length This applies to two routes on both sides. $1/2 \times$ lateral-direction length is represented by arrow E (the distance from the P terminal to the center element) in FIG. 5.

From first switching element to second switching element: $k3 \times 1/2 \times$ longitudinal-direction length $1/2 \times$ longitudinal-direction length is represented by arrow F (the distance from the first switching element to the second switching element) in FIG. 5.

From second switching element to N terminal: $k2 \times 1/2 \times$ lateral-direction length This applies to two routes on both sides. $1/2 \times$ lateral-direction length is represented by arrow E (the distance from the N terminal to the center element) in FIG. 5.

(One-Side Lateral Lead-Out)

From P terminal to first switching element: $k1 \times 5/6 \times$ lateral-direction length $5/6 \times$ lateral-direction length is represented by arrow G (the distance from the P terminal to the farthest first switching element) in FIG. 5.

From first switching element to second switching element: $k3 \times 1/2 \times$ longitudinal-direction length $1/2 \times$ longitudinal-direction length is represented by arrow H (the distance from the first switching element to the second switching element) in FIG. 5.

From second switching element to N terminal: $k2 \times 5/6 \times$ lateral-direction length $5/6 \times$ lateral-direction length is represented by arrow G (the distance to the second switching element farthest from the P terminal) in FIG. 5.

In addition to the inductance L of each route described above, the inductance L to a capacitor module located nearby is included in the actual route. As assumed sizes of the semiconductor device of the present disclosure, the length in the longitudinal direction is 50 to 60 mm, and the half of the length in the longitudinal direction is 25 to 30 mm. The upper view in FIG. 6 shows a connection example with the capacitor module in the semiconductor device 100 in the case of left-right both-side lateral lead-out, and the lower view in FIG. 6 shows a connection example with the capacitor module in the semiconductor device 100 in the case of one-side lateral lead-out. In wiring of connection shown in the upper view in FIG. 6, even though there is variation depending on the applied voltage or current, if the lengths of a gap, a wiring thickness, a gap, and a wiring thickness are respectively assumed to be 7 mm, 1 mm, 7 mm, and 1 mm, at least 16 mm is needed. The ratio of the length of 25 to 30 mm and 16 mm is 1.64 at maximum.

In a case where the capacitor module is connected on the same plane in the left-right both-side lateral lead-out, since the wiring is set as shown in the upper view in FIG. 6, the route needs 1.64 to be multiplied for a margin as a route length of $1/2 \times$ longitudinal-direction length$\times 2$ or greater. Therefore, when the length in the longitudinal direction is subtracted from the route, $k8 \times 1.64 \times 1/2 \times$ longitudinal-direction length is added as a required condition.

A condition that makes the one-turn Ls smaller in the one-side lateral lead-out structure of the present disclosure than in the comparative example is calculated below. The one-turn Ls in the longitudinal lead-out is calculated by the following Expression (2). Hereinafter, the longitudinal-direction length is referred to as a longitudinal length, and the lateral-direction length is referred to as a lateral length.

$$k4 \times 1/4 \times \text{longitudinal length} + k7 \times 1/2 \times \text{longitudinal length} + k6 \times 3/10 \times \text{lateral length} + k5 \times 3/4 \times \text{longitudinal length} \quad (2)$$

The one-turn Ls in the one-side lateral lead-out is calculated by the following Expression (3).

$$k1 \times 5/6 \times \text{lateral length} + k3 \times 1/2 \times \text{longitudinal length} + k2 \times 5/6 \times \text{lateral length} \quad (3)$$

These are substituted into Expression (4) which is a conditional expression.

$$(\text{One-turn } Ls \text{ in longitudinal lead-out}) \geq (\text{One-turn } Ls \text{ in one-side lateral lead-out}) \quad (4)$$

Values shown in FIG. 3 and FIG. 4 are substituted into Expression (4) and the expression is arranged to obtain the following.

Lateral length$\leq 1.2 \times$longitudinal length

If the lateral length is set to be not greater than 1.2 times the longitudinal length, the one-turn Ls can be assuredly made smaller than in the comparative example.

A condition that makes the one-turn Ls smaller in the left-right both-side lateral lead-out structure of the present disclosure than in the comparative example is calculated below. The one-turn Ls in the longitudinal lead-out is calculated by the following Expression (5).

$$k4 \times \tfrac{1}{4} \times \text{longitudinal length} + k7 \times \tfrac{1}{2} \times \text{longitudinal length} + k6 \times \tfrac{3}{11} \times \text{lateral length} + k5 \times \tfrac{3}{4} \times \text{longitudinal length} \quad (5)$$

The one-turn Ls in the left-right both-side lateral lead-out is calculated by the following Expression (6), including an amount corresponding to connection with the capacitor module.

$$(k1 \times \tfrac{1}{2} \times \text{lateral length} + k2 \times \tfrac{1}{2} \times \text{lateral length}) \times \tfrac{1}{2} + k2 \times \tfrac{1}{2} \times \text{lateral length} + (k8 \times 1.64 \times \tfrac{1}{2} \times \text{longitudinal length}) \times 2 \times \tfrac{1}{2} \quad (6)$$

The second stage of Expression (6) corresponds to the amount corresponding to connection with the capacitor module. It is noted that multiplication by ½ at the middle in the first stage of Expression (6) is for considering a distribution effect of two-location lead-out on both of the left and right sides. In addition, multiplication by 2 at the middle in the second stage of Expression (6) is for considering a round trip between the P terminal and the N terminal, and multiplication by ½ at the end in the second stage of Expression (6) is for considering a distribution effect of connection with the capacitor module at two locations on both of the left and right sides. These are substituted into Expression (7) which is a conditional expression.

$$(\text{One-turn } Ls \text{ in longitudinal lead-out}) \geq (\text{One-turn } Ls \text{ in left-right both-side lateral lead-out}) \quad (7)$$

Values shown in FIG. 3 and FIG. 4 are substituted and the expression is arranged to obtain the following.

$$\text{Lateral length} \leq 2.1 \times \text{longitudinal length}$$

If the lateral length is set to be not greater than 2.1 times the longitudinal length, the one-turn Ls can be assuredly made smaller than in the comparative example.

A result of parasitic inductance extraction analysis by a 3D model will be described. On the basis of 3D model data shown in FIG. 7, parasitic inductance extraction analysis was performed using software Q3D produced by ANSYS. In the upper view in FIG. 7, the right side shows 3D model data of the left-right both-side lateral lead-out structure of the present disclosure and the left side shows 3D model data of the longitudinal lead-out structure in the comparative example with respect to the left-right both-side lateral lead-out. In the lower view in FIG. 7, the right side shows 3D model data of the one-side lateral lead-out structure of the present disclosure and the left side shows 3D model data of the longitudinal lead-out structure in the comparative example with respect to the one-side lateral lead-out. In the 3D model data, the length in the longitudinal direction is 60.4 mm which is common among all these structures. The length in the lateral direction is 73.4 mm for the left-right both-side lateral lead-out, 65.6 mm for the one-side lateral lead-out, and 26.0 mm for the comparative example in the upper view. In the left-right both-side lateral lead-out, the lateral length is not greater than 2.1 times the longitudinal length, and in the one-side lateral lead-out, the lateral length is not greater than 1.2 times the longitudinal length. FIG. 8 shows the one-turn Ls which is the result of parasitic inductance extraction analysis. The one-turn Ls in the case of 2in1 wide which is the comparison target with respect to the one-side lateral lead-out structure and the one-turn Ls for U phase in the one-side lateral lead-out structure are very close to each other. In the structure of the present disclosure, the one-turn Ls is reduced as compared to the longitudinal lead-out structure of the comparative example.

In the structure of the present disclosure, since the one-turn Ls is reduced, surge in switching is reduced and high-frequency noise can be suppressed. In addition, by laterally leading out the P terminal and the N terminal, the number of P terminals and N terminals provided on the longitudinal-direction side as in the conventional case can be decreased, whereby the semiconductor device can be downsized. In addition, since the number of P terminals and N terminals connected to the outside can be decreased, productivity of the semiconductor device can be improved. In addition, although the one-turn Ls in the case of 2in1 wide which is the comparison target with respect to the one-side lateral lead-out structure and the one-turn Ls for U phase in the one-side lateral lead-out structure are very close to each other, the 2in1 wide structure uses a lead frame having a great width and thus is difficult to manufacture. Therefore, using the one-side lateral lead-out structure can improve productivity as compared to the conventional structure.

In the present embodiment, the left-right both-side lateral lead-out structure includes both of the first N terminal 651 and the second N terminal 652 and both of the first P terminal 611 and the second P terminal 612. As described above, where the distance in the first direction between the ends on the one side in the first direction of the first N terminal 651 and the first P terminal 611 and the ends on the other side in the first direction of the second N terminal 652 and the second P terminal 612 is defined as a first-direction distance, and the distance in the second direction between the ends on the one side in the second direction of the second control terminals and the second AC terminals and the ends on the other side in the second direction of the first control terminals and the first AC terminals is defined as a second-direction distance, the first-direction distance is not greater than 2.1 times the second-direction distance. With this structure, the one-turn Ls can be assuredly reduced as compared to the longitudinal lead-out structure of the comparative example.

In the present embodiment, the one-side lateral lead-out structure includes one of the first N terminal 651 and the second N terminal 652, and one of the P terminals that is provided on the same side in the first direction as the one N terminal. As described above, where the distance in the first direction between the ends in the first direction of the one N terminal and the one P terminal exposed from the resin member 90 and the end of the resin member in the first direction on the side opposite to the one N terminal and the one P terminal is defined as a first-direction distance, and the distance in the second direction between the ends on the one side in the second direction of the second control terminals and the second AC terminals and the ends on the other side in the second direction of the first control terminals and the first AC terminals is defined as a second-direction distance, the first-direction distance is not greater than 1.2 times the second-direction distance. With this structure, the one-turn Ls can be assuredly reduced as compared to the longitudinal lead-out structure of the comparative example.

<Manufacturing Method for Semiconductor Device 100>

A manufacturing method for the semiconductor device 100 will be described. The manufacturing method for the semiconductor device 100 is classified into three methods. The first and second methods are manufacturing methods for the semiconductor device 100 having the left-right both-side lateral lead-out structure, and the third method is a manufacturing method for the semiconductor device 100 having the one-side lateral lead-out structure. The difference between the first and second manufacturing methods is that, in the first method, the N terminals are provided to the first conductor 11, whereas in the second method, the N terminals are not provided to the first conductor 11.

First, the first manufacturing method for the semiconductor device 100 will be described. The manufacturing method for the semiconductor device 100 includes a member preparing step (S11), a first connection step (S12), a second connection step (S13), a third connection step (S14), a sealing step (S15), and a cutting step (S16), as shown in FIG. 9. Hereinafter, the details of each step will be described.

The member preparing step is a step of preparing members composing the semiconductor device 100. In the member preparing step, the first conductive plate 21 formed in a plate shape of which a width in the second direction perpendicular to the first direction is smaller than a width in the first direction, the second conductive plate 22, the third conductive plate 23, the fourth conductive plate 24, the three first switching elements 42, 43, 44, the three second switching elements 52, 53, 54, the first conductor 11 extending in one direction and having the first N terminal 651 provided at one end and the second N terminal 652 provided at another end, and the lead frame 1 are prepared. The lead frame 1 includes the enclosing-shape frame 1a and the plurality of in-frame terminals which are the three second AC terminals 622, 632, 642, the second conductor 32 to which the first AC terminal 621 and the first dummy terminal 321 are provided, the third conductor 33 to which the first AC terminal 631 and the third dummy terminal 331 connected to one second AC terminal 632 are provided, the fourth conductor 34 to which the first AC terminal 641 and the second dummy terminal 341 are provided, the three sets of first control terminals 7a, 7b, 7c, the three sets of second control terminals 8a, 8b, 8c, the first P terminal 611, and the second P terminal 612. The in-frame terminals are located on the inner side of the frame 1a, and the in-frame terminals are formed integrally with the frame 1a.

The first connection step is a step of connecting collector electrodes of the first switching elements 42, 43, 44 and the second switching elements 52, 53, 54, and the corresponding conductive plates. First, the second conductive plate 22, the third conductive plate 23, and the fourth conductive plate 24 are located on the one side in the second direction of the first conductive plate 21 with an interval therebetween and arranged at intervals from the one side to the other side in the first direction, on the same plane as the first conductive plate 21. Next, the three first switching elements 42, 43, 44 are arranged at intervals from the one side to the other side in the first direction on one surface of the first conductive plate 21. Next, the collector electrodes which are other surfaces of the three first switching elements 42, 43, 44 are connected to the one surface of the first conductive plate 21. Next, the collector electrodes which are other surfaces of the three second switching elements 52, 53, 54 are connected respectively to one surface of each of the second conductive plate 22, the third conductive plate 23, and the fourth conductive plate 24.

The second connection step is a step of mainly connecting specific parts between emitter electrodes of the first switching elements 42, 43, 44, the lead frame 1, and the conductive plates. First, the lead frame 1 is moved so that the first conductive plate 21, the second conductive plate 22, the third conductive plate 23, and the fourth conductive plate 24 are placed within the inner side of the frame 1a.

Next, the respective parts are connected in a state in which the lead frame 1 is located precisely. Locating and connection will be sequentially described, but locating of the lead frame 1 is performed first at the same time. In addition, also for connections between the parts, connections between parts by the same material, or the like, may be performed at the same time.

The lead frame 1 is located in a state in which the three first AC terminals 621, 631, 641 extend respectively toward the other side in the second direction relative to the first conductive plate 21, the first dummy terminal 321 extends toward the one side in the first direction relative to the first conductive plate 21, the second dummy terminal 341 extends toward the other side in the first direction relative to the first conductive plate 21, and the third dummy terminal 331 extends through between the third conductive plate 23 and the fourth conductive plate 24 toward the one side in the second direction. Next, another surface of the second conductor 32 and one surface of the first switching element 42 located on the one side in the first direction are connected to each other, another surface of the third conductor 33 and one surface of the first switching element 43 located at the center in the first direction are connected to each other, and another surface of the fourth conductor 34 and one surface of the first switching element 44 located on the other side in the first direction are connected to each other. At the same time, the end of a part of the second conductor 32 extending toward the one side in the second direction and the one surface of the second conductive plate 22 on the other side in the second direction are connected to each other, the end of a part of the third conductor 33 extending toward the one side in the second direction and the one surface of the third conductive plate 23 on the other side in the second direction are connected to each other, and the end of a part of the fourth conductor 34 extending toward the one side in the second direction and the one surface of the fourth conductive plate 24 on the other side in the second direction are connected to each other.

The lead frame 1 is located in a state in which the first P terminal 611 extends toward the one side in the first direction relative to the first conductive plate 21. The first P terminal 611 is connected to the one surface of the first conductive plate 21 on the one side in the first direction. The lead frame 1 is located in a state in which the second P terminal 612 extends toward the other side in the first direction relative to the first conductive plate 21. The second P terminal 612 is connected to the one surface of the first conductive plate 21 on the other side in the first direction. The lead frame 1 is located in a state in which the three second AC terminals 622, 632, 642 extend toward the one side in the second direction relative to the second conductive plate 22, the third conductive plate 23, and the fourth conductive plate 24. The ends on the other side in the second direction of the three second AC terminals 622, 632, 642 are connected respectively to the one surface of each of the second conductive plate 22, the third conductive plate 23, and the fourth conductive plate 24 on the one side in the second direction.

The lead frame 1 is located in a state in which the three sets of first control terminals 7a, 7b, 7c are located on the other side in the second direction of the first conductive plate 21 with an interval therebetween. The three sets of first control terminals 7a, 7b, 7c are connected respectively to the three first switching elements 42, 43, 44. In a state in which the lead frame 1 is located so that the three sets of second control terminals 8a, 8b, 8c are located respectively on the one side in the second direction of each of the second conductive plate 22, the third conductive plate 23, and the fourth conductive plate 24 with an interval therebetween, the three sets of second control terminals 8a, 8b, 8c are connected respectively to the three second switching elements 52, 53, 54.

The third connection step is a step of connecting the first conductor 11 and emitter electrodes of the second switching elements 52, 53, 54. The first conductor 11 is located on the three second switching elements 52, 53, 54 so as to extend in the first direction, the first N terminal 651 extends from the first conductor 11 toward the one side in the first direction relative to the second conductive plate 22, and the second N terminal 652 extends from the first conductor 11 toward the other side in the first direction relative to the fourth conductive plate 24. Next, another surface of the first conductor 11 and one surface of each of the three second switching elements 52, 53, 54 are connected to each other.

The sealing step is a step of sealing the entirety of the semiconductor device that has undergone the connection step, by the resin member 90, in a state in which specific parts are exposed. The exposed parts are ends of the first dummy terminal 321, the second dummy terminal 341, the first control terminals 7a, 7b, 7c, the second control terminals 8a, 8b, 8c, the first AC terminals 621, 631, 641, the second AC terminals 622, 632, 642, the first N terminal 651, the second N terminal 652, the first P terminal 611, and the second P terminal 612. In a state in which these ends are exposed, the first conductive plate 21, the second conductive plate 22, the third conductive plate 23, the fourth conductive plate 24, the first switching elements 42, 43, 44, the second switching elements 52, 53, 54, the first conductor 11, the second conductor 32, the third conductor 33, and the fourth conductor 34 are sealed by the resin member 90.

The cutting step is a step of cutting, from the frame 1a, the specific parts exposed from the resin member 90. Parts on the frame 1a side of the first dummy terminal 321, the second dummy terminal 341, the first control terminals 7a, 7b, 7c, the second control terminals 8a, 8b, 8c, the first AC terminals 621, 631, 641, the second AC terminals 622, 632, 642, the first N terminal 651, the second N terminal 652, the first P terminal 611, and the second P terminal 612, are cut by, for example, tie bar cutting. In addition, parts of the dummy connection portions 81, 82 are cut by, for example, tie bar cutting so that the terminals connected to the dummy connection portions 81, 82 are provided independently of each other. After the cutting step, as necessary, the terminals exposed from the resin member 90 are bent at an angle of 90 degrees, for example. Through the above steps, the semiconductor device 100 shown in FIG. 1 is completed.

Conventionally, in a case of performing the second connection step by brazing such as solder involving heating, the second conductor 32, the third conductor 33, and the fourth conductor 34 are deformed by self-weights during heating. In addition, in a case of using metal sintering means, the second conductor 32, the third conductor 33, and the fourth conductor 34 are deformed before heating. Thus, insufficiency and spill of solder or sintering metal occur, so that a sufficient connection strength is not obtained. In the present disclosure, each of the second conductor 32, the third conductor 33, and the fourth conductor 34 is connected to the frame 1a at least at two locations. Therefore, the ends of the second conductor 32, the third conductor 33, and the fourth conductor 34 do not droop toward the switching element side by self-weights during manufacturing in a state in which they are connected to the frame 1a. Since the ends do not droop toward the switching element side by self-weights, position displacement of the second conductor 32, the third conductor 33, and the fourth conductor 34 which are terminals connected to the switching elements can be suppressed. In addition, since the ends of the second conductor 32, the third conductor 33, and the fourth conductor 34 do not droop toward the switching element side by self-weights, insufficiency and spill of solder or sintering metal are suppressed, whereby connection failure of the second conductor 32, the third conductor 33, and the fourth conductor 34 which are terminals connected to the switching elements can be suppressed.

Next, the second manufacturing method for the semiconductor device 100 will be described. The second manufacturing method for the semiconductor device 100 also includes a member preparing step, a first connection step, a second connection step, a third connection step, a sealing step, and a cutting step, as shown in FIG. 9. Hereinafter, while description of the same steps as in the first manufacturing method for the semiconductor device 100 is omitted, the details of each step will be described.

The member preparing step is a step of preparing members composing the semiconductor device 100. In the member preparing step, the first conductive plate 21 formed in a plate shape of which a width in the second direction perpendicular to the first direction is smaller than a width in the first direction, the second conductive plate 22, the third conductive plate 23, the fourth conductive plate 24, the three first switching elements 42, 43, 44, the three second switching elements 52, 53, 54, the first conductor 11 extending in one direction, and the lead frame 1 are prepared. The lead frame 1 includes the enclosing-shape frame 1a and the plurality of in-frame terminals which are the three second AC terminals 622, 632, 642, the second conductor 32 to which the first AC terminal 621 and the first dummy terminal 321 are provided, the third conductor 33 to which the first AC terminal 631 and the third dummy terminal 331 connected to one second AC terminal 632 are provided, the fourth conductor 34 to which the first AC terminal 641 and the second dummy terminal 341 are provided, the three sets of first control terminals 7a, 7b, 7c, the three sets of second control terminals 8a, 8b, 8c, the first P terminal 611, the second P terminal 612, the first N terminal 651, and the second N terminal 652. The in-frame terminals are located on the inner side of the frame 1a, and the in-frame terminals are formed integrally with the frame 1a.

Description of the first connection step and the second connection step is omitted, and the third connection step will be described. The third connection step is a step of connecting the first conductor 11, and emitter electrodes of the second switching elements 52, 53, 54, the first N terminal 651, and the second N terminal 652. The first conductor 11 is located on the three second switching elements 52, 53, 54 so as to extend in the first direction, the first N terminal 651 extends toward the one side in the first direction relative to the second conductive plate 22, and the second N terminal 652 extends toward the other side in the first direction relative to the fourth conductive plate 24. Next, another surface of the first conductor 11 and one surface of each of the three second switching elements 52, 53, 54 are connected to each other, the one side in the first direction of the first conductor 11 and the other side in the first direction of the first N terminal 651 are connected to each other, and the other side in the first direction of the first conductor 11 and the one side in the first direction of the second N terminal 652 are connected to each other.

Description of the sealing step is omitted, and the cutting step will be described. The cutting step is a step of cutting, from the frame 1a, the specific parts exposed from the resin member 90. Parts on the frame 1a side of the first dummy terminal 321, the second dummy terminal 341, the first control terminals 7a, 7b, 7c, the second control terminals 8a, 8b, 8c, the first AC terminals 621, 631, 641, the second AC terminals 622, 632, 642, the first P terminal 611, the second P terminal 612, the first N terminal 651, and the second N terminal 652 are cut by, for example, tie bar cutting. In addition, parts of the dummy connection portions 81, 82 are cut by, for example, tie bar cutting so that the terminals connected to the dummy connection portions 81, 82 are provided independently of each other. After the cutting step, as necessary, the terminals exposed from the resin member 90 are bent at an angle of 90 degrees, for example. Through the above steps, the semiconductor device 100 shown in FIG. 1 is completed.

By performing manufacturing as described above, since the first conductor 11 does not have N terminals in the member preparing step, the first conductor 11 can be downsized and the cost for the first conductor 11 can be reduced.

Next, the third manufacturing method for the semiconductor device 100 will be described. The third manufacturing method for the semiconductor device 100 also includes a member preparing step, a first connection step, a second connection step, a third connection step, a sealing step, and a cutting step, as shown in FIG. 9. Hereinafter, while description of the same steps as in the first manufacturing method for the semiconductor device 100 is omitted, the details of each step will be described.

The member preparing step is a step of preparing members composing the semiconductor device 100. In the member preparing step, the first conductive plate 21 formed in a plate shape of which a width in the second direction perpendicular to the first direction is smaller than a width in the first direction, the second conductive plate 22, the third conductive plate 23, the fourth conductive plate 24, the three first switching elements 42, 43, 44, the three second switching elements 52, 53, 54, the first conductor 11 extending in one direction and having the first N terminal 651 as the N terminal provided at one end, and the lead frame 1 are prepared. The lead frame 1 includes the enclosing-shape frame 1a and the plurality of in-frame terminals which are the three second AC terminals 622, 632, 642, the second conductor 32 to which the first AC terminal 621 and the first dummy terminal 321 are provided, the third conductor 33 to which the first AC terminal 631 and the third dummy terminal 331 connected to one second AC terminal 632 are provided, the fourth conductor 34 to which the first AC terminal 641 and the second dummy terminal 341 are provided, the three sets of first control terminals 7a, 7b, 7c, the three sets of second control terminals 8a, 8b, 8c, and the first P terminal 611 as the P terminal. The in-frame terminals are located on the inner side of the frame 1a, and the in-frame terminals are formed integrally with the frame 1a.

Description of the first connection step is omitted, and the second connection step will be described. The second connection step is a step of mainly connecting specific parts between emitter electrodes of the first switching elements 42, 43, 44, the lead frame 1, and the conductive plates. First, the lead frame 1 is moved so that the first conductive plate 21, the second conductive plate 22, the third conductive plate 23, and the fourth conductive plate 24 are placed within the inner side of the frame 1a. Next, the respective parts are connected in a state in which the lead frame 1 is located precisely. Locating and connection will be sequentially described, but locating of the lead frame 1 is performed first at the same time. In addition, also for connections between the parts, connections between parts by the same material, or the like, may be performed at the same time.

The lead frame 1 is located in a state in which the three first AC terminals 621, 631, 641 extend respectively toward the other side in the second direction relative to the first conductive plate 21, the first dummy terminal 321 extends toward the one side in the first direction relative to the first conductive plate 21, the second dummy terminal 341 extends toward the other side in the first direction relative to the first conductive plate 21, and the third dummy terminal 331 extends through between the third conductive plate 23 and the fourth conductive plate 24 toward the one side in the second direction. Next, another surface of the second conductor 32 and one surface of the first switching element 42 located on the one side in the first direction are connected to each other, another surface of the third conductor 33 and one surface of the first switching element 43 located at the center in the first direction are connected to each other, and another surface of the fourth conductor 34 and one surface of the first switching element 44 located on the other side in the first direction are connected to each other. At the same time, the end of a part of the second conductor 32 extending toward the one side in the second direction and the one surface of the second conductive plate 22 on the other side in the second direction are connected to each other, the end of a part of the third conductor 33 extending toward the one side in the second direction and the one surface of the third conductive plate 23 on the other side in the second direction are connected to each other, and the end of a part of the fourth conductor 34 extending toward the one side in the second direction and the one surface of the fourth conductive plate 24 on the other side in the second direction are connected to each other.

The lead frame 1 is located in a state in which the first P terminal 611 extends toward the one side in the first direction relative to the first conductive plate 21. The first P terminal 611 is connected to the one surface of the first conductive plate 21 on the one side in the first direction. The lead frame 1 is located in a state in which the three second AC terminals 622, 632, 642 extend toward the one side in the second direction relative to the second conductive plate 22, the third conductive plate 23, and the fourth conductive plate 24. The ends on the other side in the second direction of the three second AC terminals 622, 632, 642 are connected respectively to the one surface of each of the second conductive plate 22, the third conductive plate 23, and the fourth conductive plate 24 on the one side in the second direction.

The lead frame 1 is located in a state in which the three sets of first control terminals 7a, 7b, 7c are located on the other side in the second direction of the first conductive plate 21 with an interval therebetween. The three sets of first control terminals 7a, 7b, 7c are connected respectively to the three first switching elements 42, 43, 44. In a state in which the three sets of second control terminals 8a, 8b, 8c are located respectively on the one side in the second direction of each of the second conductive plate 22, the third conductive plate 23, and the fourth conductive plate 24 with an interval therebetween, the three sets of second control terminals 8a, 8b, 8c are connected respectively to the three second switching elements 52, 53, 54.

Figure 12:
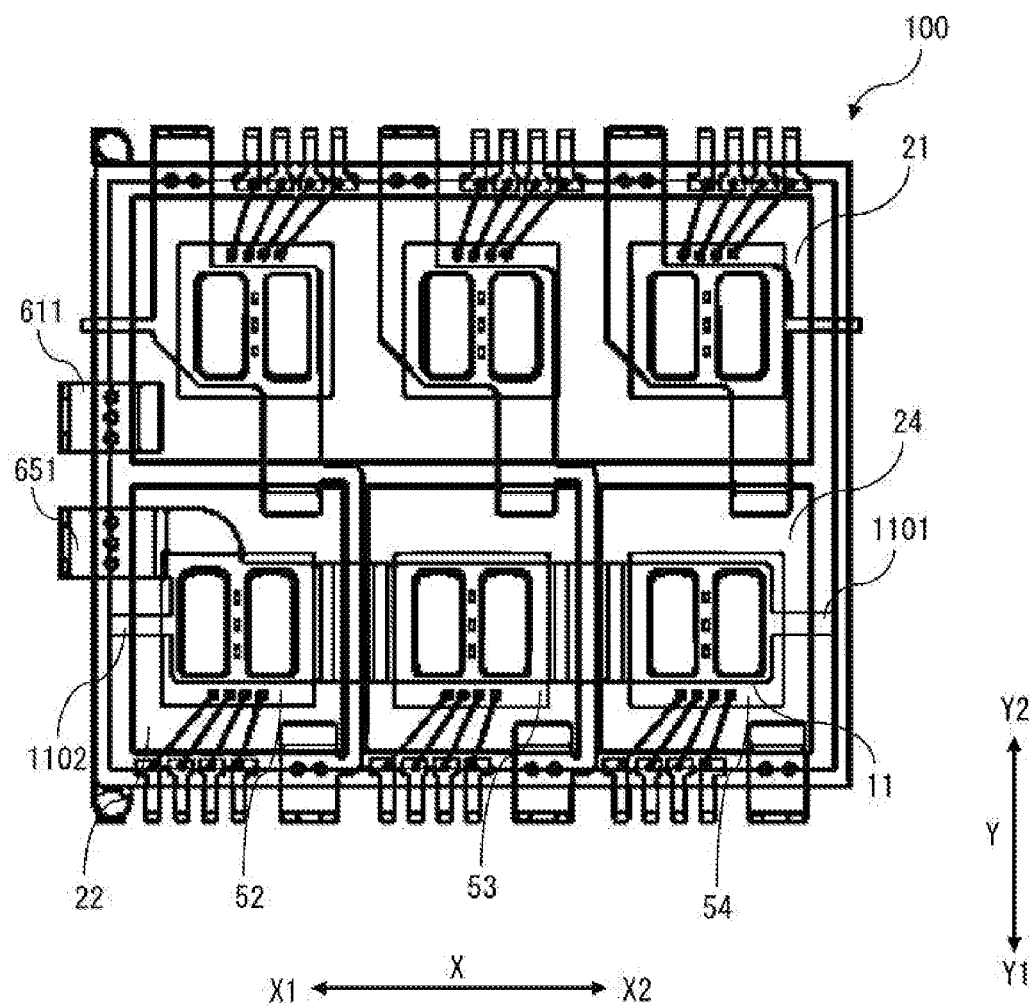
FIG. 12 is a plan view schematically showing still another semiconductor device according to the first embodiment.

The third connection step is a step of connecting the first conductor 11 and emitter electrodes of the second switching elements 52, 53, 54. The first conductor 11 is located on the three second switching elements 52, 53, 54 so as to extend in the first direction and the first N terminal 651 extends from the first conductor 11 toward the one side in the first direction relative to the second conductive plate 22. The first conductor 11 may have dummy terminals 1101, 1102, as shown in FIG. 12. FIG. 12 is a plan view schematically showing another semiconductor device 100 according to the first embodiment, in which the resin member 90 is removed and conductors are shown transparently. The dummy terminal 1101 is provided on the other side in the first direction of the first conductor 11, and the dummy terminal 1102 is provided on the one side in the first direction of the first conductor 11. In the case of providing the dummy terminals 1101, 1102, the first conductor 11 is located so that the dummy terminal 1101 extends from the first conductor 11 toward the other side in the first direction relative to the fourth conductive plate 24 and the dummy terminal 1102 extends from the first conductor 11 toward the one side in the first direction relative to the second conductive plate 22. The dummy terminals 1101, 1102 are terminals used for positioning, in order to improve precision of positioning of the first conductor 11. As the dummy terminal, only the dummy terminal 1101 may be provided. Next, another surface of the first conductor 11 and one surface of each of the three second switching elements 52, 53, 54 are connected to each other.

The sealing step is a step of sealing the entirety of the semiconductor device that has undergone the connection step, by the resin member 90, in a state in which specific parts are exposed. The exposed parts are ends of the first dummy terminal 321, the second dummy terminal 341, the first control terminals 7a, 7b, 7c, the second control terminals 8a, 8b, 8c, the first AC terminals 621, 631, 641, the second AC terminals 622, 632, 642, the first N terminal 651, and the first P terminal 611. In a state in which these ends are exposed, the first conductive plate 21, the second conductive plate 22, the third conductive plate 23, the fourth conductive plate 24, the first switching elements 42, 43, 44, the second switching elements 52, 53, 54, the first conductor 11, the second conductor 32, the third conductor 33, and the fourth conductor 34 are sealed by the resin member 90.

The cutting step is a step of cutting, from the frame 1a, the specific parts exposed from the resin member 90. Parts on the frame 1a side of the first dummy terminal 321, the second dummy terminal 341, the first control terminals 7a, 7b, 7c, the second control terminals 8a, 8b, 8c, the first AC terminals 621, 631, 641, the second AC terminals 622, 632, 642, the first N terminal 651, and the first P terminal 611 are cut by, for example, tie bar cutting. In addition, parts of the dummy connection portions 81, 82 are cut by, for example, tie bar cutting so that the terminals connected to the dummy connection portions 81, 82 are provided independently of each other. After the cutting step, as necessary, the terminals exposed from the resin member 90 are bent at an angle of 90 degrees, for example. Through the above steps, the semiconductor device 100 having the one-side lateral lead-out structure shown in FIG. 5 is completed.

By performing manufacturing as described above, even in a case where the semiconductor device 100 has the one-side lateral lead-out structure, the ends of the second conductor 32, the third conductor 33, and the fourth conductor 34 do not droop toward the switching element side by self-weights during manufacturing in a state in which they are connected to the frame 1a. Thus, position displacement of the second conductor 32, the third conductor 33, and the fourth conductor 34 which are terminals connected to the switching elements can be suppressed. In addition, since the ends of the second conductor 32, the third conductor 33, and the fourth conductor 34 do not droop toward the switching element side by self-weights, insufficiency and spill of solder or sintering metal are suppressed, whereby connection failure of the second conductor 32, the third conductor 33, and the fourth conductor 34 which are terminals connected to the switching elements can be suppressed.

As described above, the semiconductor device 100 according to the first embodiment includes the first dummy terminal 321, the second dummy terminal 341, and the third dummy terminal 331, and in a state in which the ends of the first dummy terminal 321, the second dummy terminal 341, the first control terminals 7a, 7b, 7c, the second control terminals 8a, 8b, 8c, the first AC terminals 621, 631, 641, the second AC terminals 622, 632, 642, the N terminal, and the P terminal are exposed, the first conductive plate 21, the second conductive plate 22, the third conductive plate 23, the fourth conductive plate 24, the first switching elements 42, 43, 44, the second switching elements 52, 53, 54, the first conductor 11, the second conductor 32, the third conductor 33, and the fourth conductor 34 are sealed by the resin member 90. Therefore, the ends of the second conductor 32, the third conductor 33, and the fourth conductor 34 do not droop toward the switching element side by self-weights during manufacturing. Thus, position displacement of the second conductor 32, the third conductor 33, and the fourth conductor 34 which are terminals connected to the switching elements can be suppressed. In addition, since the ends of the second conductor 32, the third conductor 33, and the fourth conductor 34 do not droop toward the switching element side by self-weights, solder void, solder insufficiency, and solder spill are suppressed at the time of connecting them to the switching elements by brazing means such as solder. Thus, connection failure of the second conductor 32, the third conductor 33, and the fourth conductor 34 which are terminals connected to the switching elements can be suppressed. In addition, since both of the P terminal and the N terminal are provided so as to be exposed from the insulation member in the first direction, the one-turn Ls can be reduced. In addition, the length in the first direction of the semiconductor device 100 is determined by the three AC terminals and the three sets of control terminals. Therefore, as compared to the conventional example in which the three AC terminals and the control signal group for six switching units are located on the long-side side, the length corresponding to three sets of control terminals is eliminated, whereby the semiconductor device 100 can be downsized.

In the manufacturing method for the semiconductor device 100 according to the first embodiment, each of the second conductor 32, the third conductor 33, and the fourth conductor 34 is connected to the frame 1a at least at two locations. Therefore, the ends of the second conductor 32, the third conductor 33, and the fourth conductor 34 do not droop toward the switching element side by self-weights during manufacturing in a state in which they are connected to the frame 1a. Thus, position displacement of the second conductor 32, the third conductor 33, and the fourth conductor 34 which are terminals connected to the switching elements can be suppressed. In addition, since the ends of the second conductor 32, the third conductor 33, and the fourth conductor 34 do not droop toward the switching element side by self-weights, solder void, solder insufficiency, and solder spill are suppressed at the time of connecting them to the switching elements by brazing means such as solder. Thus, connection failure of the second conductor 32, the third conductor 33, and the fourth conductor 34 which are terminals connected to the switching elements can be suppressed. In addition, since both of the P terminal and the N terminal are provided so as to be exposed from the insulation member in the first direction, the one-turn Ls can be reduced. In addition, the length in the first direction of the semiconductor device 100 is determined by the three AC terminals and the three sets of control terminals. Therefore, as compared to the conventional example in which the three AC terminals and the control signal group for six switching units are located on the long-side side, the length corresponding to three sets of control terminals is eliminated, whereby the semiconductor device 100 can be downsized.

Second Embodiment

Figure 13:
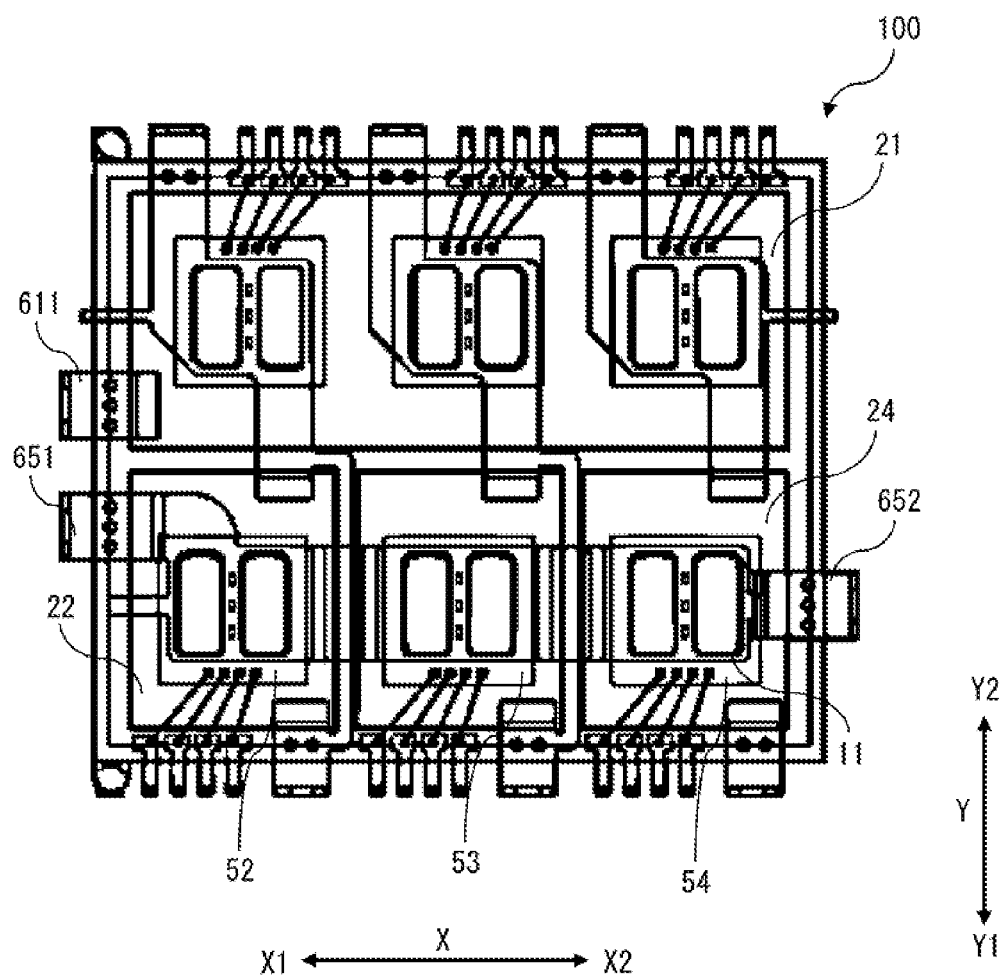
FIG. 13 is a plan view schematically showing a semiconductor device according to the second embodiment of the present disclosure.

A semiconductor device 100 according to the second embodiment will be described. FIG. 13 is a plan view schematically showing the semiconductor device 100 according to the second embodiment, in which the resin member 90 is removed and conductors are shown transparently. In the semiconductor device 100 according to the second embodiment, only the N terminals are provided on both sides in the first direction.

The first conductor 11 which is a lead frame extends in the first direction and is connected to one surface of each of the second switching elements 52, 53, 54. The first N terminal 651 extends from the first conductor 11 toward the one side in the first direction relative to the second conductive plate 22. The second N terminal 652 extends from the first conductor 11 toward the other side in the first direction relative to the fourth conductive plate 24. The semiconductor device 100 includes only the first P terminal 611. The first P terminal 611 is connected to one surface of the first conductive plate 21 on the one side in the first direction, and extends toward the one side in the first direction relative to the first conductive plate 21.

A result of parasitic inductance extraction analysis by a 3D model for the above structure will be described. As in the first embodiment, parasitic inductance extraction analysis was performed using software Q3D produced by ANSYS. Analysis results of the one-turn Ls for three phases were 12.65 nH, 11.92 nH, and 11.11 nH. All these values were smaller as compared to the result for the one-side lateral lead-out shown on the right side in FIG. 8. In the case of providing only the N terminals on both sides in the first direction, the one-turn Ls can be reduced as compared to the one-side lateral lead-out structure for both of the N terminal and the P terminal.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

Hereinafter, modes of the present disclosure are summarized as additional notes.

Additional Note 1

A semiconductor device comprising:
a first conductive plate formed in a plate shape of which a width in a second direction perpendicular to a first direction is smaller than a width in the first direction;
a second conductive plate, a third conductive plate, and a fourth conductive plate located on one side in the second direction of the first conductive plate with an interval therebetween and arranged at intervals from one side to another side in the first direction, on the same plane as the first conductive plate;
three first switching elements which are arranged at intervals from the one side to the other side in the first direction on one surface of the first conductive plate, and of which other surfaces are connected to the one surface of the first conductive plate;
three second switching elements of which other surfaces are connected respectively to one surface of each of the second conductive plate, the third conductive plate, and the fourth conductive plate;
a first conductor extending in the first direction and connected to one surface of each of the three second switching elements;
a second conductor connecting the one surface of the second conductive plate and one surface of the first switching element located on the one side in the first direction;
a third conductor connecting the one surface of the third conductive plate and one surface of the first switching element located at a center in the first direction;
a fourth conductor connecting the one surface of the fourth conductive plate and one surface of the first switching element located on the other side in the first direction;
as control terminals, three sets of first control terminals located on another side in the second direction of the first conductive plate with an interval therebetween, and connected respectively to the three first switching elements;
as the control terminals, three sets of second control terminals located respectively on the one side in the second direction of each of the second conductive plate, the third conductive plate, and the fourth conductive plate with an interval therebetween, and connected respectively to the three second switching elements;
as AC terminals, three second AC terminals connected respectively to the one surface of each of the second conductive plate, the third conductive plate, and the fourth conductive plate on the one side in the second direction, and extending toward the one side in the second direction relative to the second conductive plate, the third conductive plate, and the fourth conductive plate;
as the AC terminals, three first AC terminals extending respectively from the second conductor, the third conductor, and the fourth conductor toward the other side in the second direction relative to the first conductive plate;
as an N terminal, one or both of a first N terminal extending from the first conductor toward the one side in the first direction relative to the second conductive plate and a second N terminal extending from the first conductor toward the other side in the first direction relative to the fourth conductive plate;
as a P terminal, one or both of a first P terminal connected to the one surface of the first conductive plate on the one side in the first direction and extending toward the one side in the first direction relative to the first conductive plate, and a second P terminal connected to the one surface of the first conductive plate on the other side in the first direction and extending toward the other side in the first direction relative to the first conductive plate;

a first dummy terminal extending from the second conductor toward the one side in the first direction relative to the first conductive plate;

a second dummy terminal extending from the fourth conductor toward the other side in the first direction relative to the first conductive plate; and a third dummy terminal extending from the third conductor through between the third conductive plate and the fourth conductive plate toward the one side in the second direction, and connected to the second AC terminal connected to the third conductive plate, wherein in a state in which ends of the first dummy terminal, the second dummy terminal, the first control terminals, the second control terminals, the first AC terminals, the second AC terminals, the N terminal, and the P terminal are exposed, the first conductive plate, the second conductive plate, the third conductive plate, the fourth conductive plate, the first switching elements, the second switching elements, the first conductor, the second conductor, the third conductor, and the fourth conductor are sealed by a resin member.

Additional Note 2

The semiconductor device according to additional note 1, further comprising a fourth dummy terminal extending from the second conductor through between the second conductive plate and the third conductive plate toward the one side in the second direction, and connected to the second AC terminal connected to the second conductive plate.

Additional Note 3

The semiconductor device according to additional note 1 or 2, wherein
ends, exposed from the resin member, of a plurality of target terminals which are the first dummy terminal, the second dummy terminal, the first control terminals, the second control terminals, the second AC terminals, the first AC terminals, and the P terminal, are formed integrally with a frame enclosing a periphery around the plurality of target terminals, and
parts on the frame side of the plurality of target terminals are cutting portions to be cut.

Additional Note 4

The semiconductor device according to any one of additional notes 1 to 3, wherein
the semiconductor device comprises both of the first N terminal and the second N terminal and both of the first P terminal and the second P terminal, and
where a distance in the first direction between ends on the one side in the first direction of the first N terminal and the first P terminal and ends on the other side in the first direction of the second N terminal and the second P terminal is defined as a first-direction distance, and a distance in the second direction between ends on the one side in the second direction of the second control terminals and the second AC terminals and ends on the other side in the second direction of the first control terminals and the first AC terminals is defined as a second-direction distance, the first-direction distance is not greater than 2.1 times the second-direction distance.

Additional Note 5

The semiconductor device according to any one of additional notes 1 to 3, wherein
the semiconductor device comprises one of the first N terminal and the second N terminal, and one of the P terminals that is provided on the same side in the first direction as the one N terminal, and
where a distance in the first direction between ends in the first direction of the one N terminal and the one P terminal exposed from the resin member and an end of the resin member in the first direction on a side opposite to the one N terminal and the one P terminal is defined as a first-direction distance, and a distance in the second direction between ends on the one side in the second direction of the second control terminals and the second AC terminals and ends on the other side in the second direction of the first control terminals and the first AC terminals is defined as a second-direction distance, the first-direction distance is not greater than 1.2 times the second-direction distance.

Additional Note 6

The semiconductor device according to any one of additional notes 1 to 5, wherein
each of the first switching elements and the second switching elements is composed of one element of a MOSFET or an RC-IGBT formed from a silicon semiconductor element or a wide bandgap semiconductor element.

Additional Note 7

The semiconductor device according to any one of additional notes 1 to 5, wherein
each of the first switching elements and the second switching elements is composed of a plurality of elements including an IGBT and a diode formed from a silicon semiconductor element or a wide bandgap semiconductor element.

DESCRIPTION OF THE REFERENCE CHARACTERS 1 lead frame
1a frame
11 first conductor
11a, 11b protrusion
1101, 1102 dummy terminal
21 first conductive plate
22 second conductive plate
23 third conductive plate
24 fourth conductive plate
32 second conductor
33 third conductor
34 fourth conductor
42, 43, 44 first switching element
421 IGBT
422 diode
52, 53, 54 second switching element
321 first dummy terminal
341 second dummy terminal 331 third dummy terminal
322 fourth dummy terminal
611 first P terminal
612 second P terminal
621, 631, 641 first AC terminal
622, 632, 642 second AC terminal
651 first N terminal
652 second N terminal
7a, 7b, 7c first control terminal
8a, 8b, 8c second control terminal
81, 82 dummy connection portion
90 resin member
91 capacitor module
100 semiconductor device

What is claimed is:

1. A semiconductor device comprising:
a first conductive plate formed in a plate shape of which a width in a second direction perpendicular to a first direction is smaller than a width in the first direction;
a second conductive plate, a third conductive plate, and a fourth conductive plate located on one side in the second direction of the first conductive plate with an interval therebetween and arranged at intervals from one side to another side in the first direction, on the same plane as the first conductive plate;
three first switching elements which are arranged at intervals from the one side to the other side in the first direction on one surface of the first conductive plate, and of which other surfaces are connected to the one surface of the first conductive plate;
three second switching elements of which other surfaces are connected respectively to one surface of each of the second conductive plate, the third conductive plate, and the fourth conductive plate;
a first conductor extending in the first direction and connected to one surface of each of the three second switching elements;
a second conductor connecting the one surface of the second conductive plate and one surface of the first switching element located on the one side in the first direction;
a third conductor connecting the one surface of the third conductive plate and one surface of the first switching element located at a center in the first direction;
a fourth conductor connecting the one surface of the fourth conductive plate and one surface of the first switching element located on the other side in the first direction;
as control terminals, three sets of first control terminals located on another side in the second direction of the first conductive plate with an interval therebetween, and connected respectively to the three first switching elements;
as the control terminals, three sets of second control terminals located respectively on the one side in the second direction of each of the second conductive plate, the third conductive plate, and the fourth conductive plate with an interval therebetween, and connected respectively to the three second switching elements;
as AC terminals, three second AC terminals connected respectively to the one surface of each of the second conductive plate, the third conductive plate, and the fourth conductive plate on the one side in the second direction, and extending toward the one side in the second direction relative to the second conductive plate, the third conductive plate, and the fourth conductive plate;
as the AC terminals, three first AC terminals extending respectively from the second conductor, the third conductor, and the fourth conductor toward the other side in the second direction relative to the first conductive plate;
as an N terminal, one or both of a first N terminal extending from the first conductor toward the one side in the first direction relative to the second conductive plate and a second N terminal extending from the first conductor toward the other side in the first direction relative to the fourth conductive plate;
as a P terminal, one or both of a first P terminal connected to the one surface of the first conductive plate on the one side in the first direction and extending toward the one side in the first direction relative to the first conductive plate, and a second P terminal connected to the one surface of the first conductive plate on the other side in the first direction and extending toward the other side in the first direction relative to the first conductive plate;
a first dummy terminal extending from the second conductor toward the one side in the first direction relative to the first conductive plate;
a second dummy terminal extending from the fourth conductor toward the other side in the first direction relative to the first conductive plate; and
a third dummy terminal extending from the third conductor through between the third conductive plate and the fourth conductive plate toward the one side in the second direction, and connected to the second AC terminal connected to the third conductive plate, wherein
in a state in which ends of the first dummy terminal, the second dummy terminal, the first control terminals, the second control terminals, the first AC terminals, the second AC terminals, the N terminal, and the P terminal are exposed, the first conductive plate, the second conductive plate, the third conductive plate, the fourth conductive plate, the first switching elements, the second switching elements, the first conductor, the second conductor, the third conductor, and the fourth conductor are sealed by a resin member.

2. The semiconductor device according to claim 1, further comprising a fourth dummy terminal extending from the second conductor through between the second conductive plate and the third conductive plate toward the one side in the second direction, and connected to the second AC terminal connected to the second conductive plate.

3. The semiconductor device according to claim 1, wherein
ends, exposed from the resin member, of a plurality of target terminals which are the first dummy terminal, the second dummy terminal, the first control terminals, the second control terminals, the second AC terminals, the first AC terminals, and the P terminal, are formed integrally with a frame enclosing a periphery around the plurality of target terminals, and
parts on the frame side of the plurality of target terminals are cutting portions to be cut.

4. The semiconductor device according to claim 1, wherein
the semiconductor device comprises both of the first N terminal and the second N terminal and both of the first P terminal and the second P terminal, and where a distance in the first direction between ends on the one side in the first direction of the first N terminal and the first P terminal and ends on the other side in the first direction of the second N terminal and the second P terminal is defined as a first-direction distance, and a distance in the second direction between ends on the one side in the second direction of the second control terminals and the second AC terminals and ends on the other side in the second direction of the first control terminals and the first AC terminals is defined as a second-direction distance, the first-direction distance is not greater than 2.1 times the second-direction distance.

5. The semiconductor device according to claim 1, wherein
the semiconductor device comprises one of the first N terminal and the second N terminal, and one of the P terminals that is provided on the same side in the first direction as the one N terminal, and
where a distance in the first direction between ends in the first direction of the one N terminal and the one P terminal exposed from the resin member and an end of the resin member in the first direction on a side opposite to the one N terminal and the one P terminal is defined as a first-direction distance, and a distance in the second direction between ends on the one side in the second direction of the second control terminals and the second AC terminals and ends on the other side in the second direction of the first control terminals and the first AC terminals is defined as a second-direction distance, the first-direction distance is not greater than 1.2 times the second-direction distance.

6. The semiconductor device according to claim 1, wherein
each of the first switching elements and the second switching elements is composed of one element of a MOSFET or an RC-IGBT formed from a silicon semiconductor element or a wide bandgap semiconductor element.

7. The semiconductor device according to claim 1, wherein
each of the first switching elements and the second switching elements is composed of a plurality of elements including an IGBT and a diode formed from a silicon semiconductor element or a wide bandgap semiconductor element.

8. A manufacturing method for a semiconductor device, comprising:
a member preparing step of preparing
a first conductive plate formed in a plate shape of which a width in a second direction perpendicular to a first direction is smaller than a width in the first direction,
a second conductive plate,
a third conductive plate,
a fourth conductive plate,
three first switching elements,
three second switching elements,
a first conductor extending in one direction and having a first N terminal provided at one end and a second N terminal provided at another end, and
a lead frame including an enclosing-shape frame and a plurality of in-frame terminals which are three second AC terminals, a second conductor to which a first AC terminal and a first dummy terminal are provided, a third conductor to which a first AC terminal and a third dummy terminal connected to one of the second AC terminals are provided, a fourth conductor to which a first AC terminal and a second dummy terminal are provided, three sets of first control terminals, three sets of second control terminals, a first P terminal, and a second P terminal, the in-frame terminals being located on an inner side of the frame, the in-frame terminals being formed integrally with the frame;

a first connection step of
locating the second conductive plate, the third conductive plate, and the fourth conductive plate on one side in the second direction of the first conductive plate with an interval therebetween and arranging the second conductive plate, the third conductive plate, and the fourth conductive plate at intervals from one side to another side in the first direction, on the same plane as the first conductive plate,
arranging the three first switching elements at intervals from the one side to the other side in the first direction on one surface of the first conductive plate,
connecting other surfaces of the three first switching elements to the one surface of the first conductive plate, and
connecting other surfaces of the three second switching elements respectively to one surface of each of the second conductive plate, the third conductive plate, and the fourth conductive plate;

a second connection step of
moving the lead frame so that the first conductive plate, the second conductive plate, the third conductive plate, and the fourth conductive plate are placed within the inner side of the frame,
in a state in which the lead frame is located so that the three first AC terminals extend toward another side in the second direction relative to the first conductive plate, the first dummy terminal extends toward the one side in the first direction relative to the first conductive plate, the second dummy terminal extends toward the other side in the first direction relative to the first conductive plate, and the third dummy terminal extends through between the third conductive plate and the fourth conductive plate toward the one side in the second direction, connecting another surface of the second conductor and one surface of the first switching element located on the one side in the first direction to each other, connecting another surface of the third conductor and one surface of the first switching element located at a center in the first direction to each other, connecting another surface of the fourth conductor and one surface of the first switching element located on the other side in the first direction to each other, connecting an end of a part of the second conductor extending toward the one side in the second direction and the one surface of the second conductive plate on the other side in the second direction to each other, connecting an end of a part of the third conductor extending toward the one side in the second direction and the one surface of the third conductive plate on the other side in the second direction to each other, and connecting an end of a part of the fourth conductor extending toward the one side in the second direction and the one surface of the fourth conductive plate on the other side in the second direction to each other,
in a state in which the lead frame is located so that the first P terminal extends toward the one side in the first direction relative to the first conductive plate, connecting the first P terminal to the one surface of the first conductive plate on the one side in the first direction, in a state in which the lead frame is located so that the second P terminal extends toward the other side in the first direction relative to the first conductive plate, connecting the second P terminal to the one surface of the first conductive plate on the other side in the first direction, in a state in which the lead frame is located so that the three second AC terminals extend toward the one side in the second direction relative to the second conductive plate, the third conductive plate, and the fourth conductive plate, connecting ends on the other side in the second direction of the three second AC terminals respectively to the one surface of each of the second conductive plate, the third conductive plate, and the fourth conductive plate on the one side in the second direction, in a state in which the lead frame is located so that the three sets of first control terminals are located on the other side in the second direction of the first conductive plate with an interval therebetween, connecting the three sets of first control terminals respectively to the three first switching elements, and in a state in which the lead frame is located so that the three sets of second control terminals are located respectively on the one side in the second direction of each of the second conductive plate, the third conductive plate, and the fourth conductive plate with an interval therebetween, connecting the three sets of second control terminals respectively to the three second switching elements;

a third connection step of, in a state in which the first conductor is located on the three second switching elements so as to extend in the first direction, the first N terminal extends from the first conductor toward the one side in the first direction relative to the second conductive plate, and the second N terminal extends from the first conductor toward the other side in the first direction relative to the fourth conductive plate, connecting another surface of the first conductor and one surface of each of the three second switching elements to each other;

a sealing step of, in a state in which ends of the first dummy terminal, the second dummy terminal, the first control terminals, the second control terminals, the first AC terminals, the second AC terminals, the first N terminal, the second N terminal, the first P terminal, and the second P terminal are exposed, sealing the first conductive plate, the second conductive plate, the third conductive plate, the fourth conductive plate, the first switching elements, the second switching elements, the first conductor, the second conductor, the third conductor, and the fourth conductor by a resin member; and a cutting step of cutting parts on the frame side of the first dummy terminal, the second dummy terminal, the first control terminals, the second control terminals, the first AC terminals, the second AC terminals, the first P terminal, and the second P terminal.

9. A manufacturing method for a semiconductor device, comprising:

a member preparing step of preparing a first conductive plate formed in a plate shape of which a width in a second direction perpendicular to a first direction is smaller than a width in the first direction, a second conductive plate, a third conductive plate, a fourth conductive plate, three first switching elements, three second switching elements, a first conductor extending in one direction, and a lead frame including an enclosing-shape frame and a plurality of in-frame terminals which are three second AC terminals, a second conductor to which a first AC terminal and a first dummy terminal are provided, a third conductor to which a first AC terminal and a third dummy terminal connected to one of the second AC terminals are provided, a fourth conductor to which a first AC terminal and a second dummy terminal are provided, three sets of first control terminals, three sets of second control terminals, a first P terminal, a second P terminal, a first N terminal, and a second N terminal, the in-frame terminals being located on an inner side of the frame, the in-frame terminals being formed integrally with the frame;

a first connection step of locating the second conductive plate, the third conductive plate, and the fourth conductive plate on one side in the second direction of the first conductive plate with an interval therebetween and arranging the second conductive plate, the third conductive plate, and the fourth conductive plate at intervals from one side to another side in the first direction, on the same plane as the first conductive plate, arranging the three first switching elements at intervals from the one side to the other side in the first direction on one surface of the first conductive plate, connecting other surfaces of the three first switching elements to the one surface of the first conductive plate, and connecting other surfaces of the three second switching elements respectively to one surface of each of the second conductive plate, the third conductive plate, and the fourth conductive plate;

a second connection step of moving the lead frame so that the first conductive plate, the second conductive plate, the third conductive plate, and the fourth conductive plate are placed within the inner side of the frame, in a state in which the lead frame is located so that the three first AC terminals extend toward another side in the second direction relative to the first conductive plate, the first dummy terminal extends toward the one side in the first direction relative to the first conductive plate, the second dummy terminal extends toward the other side in the first direction relative to the first conductive plate, and the third dummy terminal extends through between the third conductive plate and the fourth conductive plate toward the one side in the second direction, connecting another surface of the second conductor and one surface of the first switching element located on the one side in the first direction to each other, connecting another surface of the third conductor and one surface of the first switching element located at a center in the first direction to each other, connecting another surface of the fourth conductor and one surface of the first switching element located on the other side in the first direction to each other, connecting an end of a part of the second conductor extending toward the one side in the second direction and the one surface of the second conductive plate on the other side in the second direction to each other, connecting an end of a part of the third conductor extending toward the one side in the second direction and the one surface of the third conductive plate on the other side in the second direction to each other, and connecting an end of a part of the fourth conductor extending toward the one side in the second direction and the one surface of the fourth conductive plate on the other side in the second direction to each other, in a state in which the lead frame is located so that the first P terminal extends toward the one side in the first direction relative to the first conductive plate, connecting the first P terminal to the one surface of the first conductive plate on the one side in the first direction, in a state in which the lead frame is located so that the second P terminal extends toward the other side in the first direction relative to the first conductive plate, connecting the second P terminal to the one surface of the first conductive plate on the other side in the first direction, in a state in which the lead frame is located so that the three second AC terminals extend toward the one side in the second direction relative to the second conductive plate, the third conductive plate, and the fourth conductive plate, connecting ends on the other side in the second direction of the three second AC terminals respectively to the one surface of each of the second conductive plate, the third conductive plate, and the fourth conductive plate on the one side in the second direction, in a state in which the lead frame is located so that the three sets of first control terminals are located on the other side in the second direction of the first conductive plate with an interval therebetween, connecting the three sets of first control terminals respectively to the three first switching elements, and in a state in which the lead frame is located so that the three sets of second control terminals are located respectively on the one side in the second direction of each of the second conductive plate, the third conductive plate, and the fourth conductive plate with an interval therebetween, connecting the three sets of second control terminals respectively to the three second switching elements;

a third connection step of, in a state in which the first conductor is located on the three second switching elements so as to extend in the first direction, the first N terminal extends toward the one side in the first direction relative to the second conductive plate, and the second N terminal extends toward the other side in the first direction relative to the fourth conductive plate, connecting another surface of the first conductor and one surface of each of the three second switching elements to each other, connecting the one side in the first direction of the first conductor and the other side in the first direction of the first N terminal to each other, and connecting the other side in the first direction of the first conductor and the one side in the first direction of the second N terminal to each other;

a sealing step of, in a state in which ends of the first dummy terminal, the second dummy terminal, the first control terminals, the second control terminals, the first AC terminals, the second AC terminals, the first N terminal, the second N terminal, the first P terminal, and the second P terminal are exposed, sealing the first conductive plate, the second conductive plate, the third conductive plate, the fourth conductive plate, the first switching elements, the second switching elements, the first conductor, the second conductor, the third conductor, and the fourth conductor by a resin member; and a cutting step of cutting parts on the frame side of the first dummy terminal, the second dummy terminal, the first control terminals, the second control terminals, the first AC terminals, the second AC terminals, the first P terminal, the second P terminal, the first N terminal, and the second N terminal.

\* \* \* \* \*